United States Patent
Lee et al.

(10) Patent No.: US 10,352,964 B2
(45) Date of Patent: Jul. 16, 2019

(54) CANTILEVER SET FOR ATOMIC FORCE MICROSCOPES, SUBSTRATE SURFACE INSPECTION APPARATUS INCLUDING THE SAME, METHOD OF ANALYZING SURFACE OF SEMICONDUCTOR SUBSTRATE BY USING THE SAME, AND METHOD OF FORMING MICROPATTERN BY USING THE SAME

(71) Applicant: Samsung Electronics Co., Ltd., Suwon-si, Gyeonggi-do (KR)

(72) Inventors: Kyeong-mi Lee, Suwon-si (KR); Jeong-ju Park, Hwaseong-si (KR); Shi-yong Yi, Seongnam-si (KR); Eun-sung Kim, Seoul (KR); Seung-chul Kwon, Suwon-si (KR); Sang-ouk Kim, Daejeon (KR); Young-joo Choi, Daejeon (KR)

(73) Assignees: SAMSUNG ELECTRONICS CO., LTD., Suwon-si, Gyeonggi-do (KR); KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 53 days.

(21) Appl. No.: 15/415,034

(22) Filed: Jan. 25, 2017

(65) Prior Publication Data
US 2017/0212145 A1    Jul. 27, 2017

(30) Foreign Application Priority Data

Jan. 26, 2016   (KR) .................. 10-2016-0009481

(51) Int. Cl.
G01Q 70/14    (2010.01)
G01Q 60/28    (2010.01)
(Continued)

(52) U.S. Cl.
CPC ............ G01Q 60/28 (2013.01); G01Q 60/42 (2013.01); G01Q 70/14 (2013.01);
(Continued)

(58) Field of Classification Search
CPC ......... G01Q 60/28; G01Q 60/42; G01Q 70/14
See application file for complete search history.

(56) References Cited

U.S. PATENT DOCUMENTS 7,036,357 B2 *  5/2006  Adderton ............... B82Y 35/00
                                                   73/105
7,241,994 B2     7/2007  Hasegawa et al.
(Continued)

FOREIGN PATENT DOCUMENTS

JP   11-248722 A    9/1999
JP   2000-275162 A  10/2000
(Continued)

OTHER PUBLICATIONS

Ton-That, et al., "XPS and AFM Surface Studies of Solvent-Cast PSPMMA Blends" Polymer vol. 42 (2001) pp. 1121-1129.
(Continued)

*Primary Examiner* — Wyatt A Stoffa
(74) *Attorney, Agent, or Firm* — Lee & Morse, P.C.

(57) ABSTRACT

A method of forming a micropattern, a substrate surface inspection apparatus, a cantilever set for an atomic force microscope, and a method of analyzing a surface of a semiconductor substrate, and a probe tip the method including forming pinning patterns on a semiconductor substrate; forming a neutral pattern layer in spaces between the pinning patterns; and inspecting a surface of a guide layer that includes the pinning patterns and the neutral pattern layer by using an atomic force microscope (AFM).

14 Claims, 36 Drawing Sheets

(51) Int. Cl.
*H01L 21/67* (2006.01)
*G01Q 60/42* (2010.01)
*H01L 27/108* (2006.01)

(52) U.S. Cl.
CPC .. *H01L 21/67288* (2013.01); *H01L 27/10876* (2013.01); *H01L 27/10885* (2013.01); *H01L 27/10888* (2013.01)

(56) References Cited

U.S. PATENT DOCUMENTS

| | | | | |
|---|---|---|---|---|
| 7,523,650 | B2* | 4/2009 | Wang | G01Q 70/06 |
| | | | | 250/306 |
| 7,958,566 | B2 | 6/2011 | Lee et al. | |
| 8,484,758 | B2 | 7/2013 | Martines et al. | |
| 2003/0075682 | A1* | 4/2003 | Colbert | B82Y 10/00 |
| | | | | 250/306 |
| 2003/0094036 | A1* | 5/2003 | Adderton | G01Q 10/045 |
| | | | | 73/105 |
| 2004/0228962 | A1* | 11/2004 | Liu | G01Q 70/06 |
| | | | | 427/58 |
| 2005/0208304 | A1* | 9/2005 | Collier | B01J 23/745 |
| | | | | 428/403 |
| 2006/0191329 | A1* | 8/2006 | Adderton | B82Y 35/00 |
| | | | | 73/105 |
| 2008/0113099 | A1* | 5/2008 | Mirkin | B82B 3/00 |
| | | | | 427/287 |
| 2008/0121029 | A1 | 5/2008 | Kitazawa et al. | |
| 2009/0227040 | A1* | 9/2009 | Sahin | B82Y 35/00 |
| | | | | 436/94 |
| 2011/0165341 | A1 | 7/2011 | Mirkin et al. | |
| 2013/0037419 | A1* | 2/2013 | Parker | G01Q 60/42 |
| | | | | 205/766 |
| 2013/0111637 | A1 | 5/2013 | Roman Garcia et al. | |
| 2014/0352006 | A1* | 11/2014 | Balagurusamy | B82Y 35/00 |
| | | | | 850/34 |
| 2015/0309073 | A1* | 10/2015 | Mirkin | B82Y 40/00 |
| | | | | 850/55 |

FOREIGN PATENT DOCUMENTS

| | | |
|---|---|---|
| KR | 10-0372307 B1 | 2/2003 |
| KR | 10-2004-0096530 A | 11/2004 |
| KR | 10-0869046 B1 | 11/2008 |
| KR | 10-2011-0070031 A | 6/2011 |
| KR | 10-1135086 B1 | 4/2012 |
| KR | 10-2013-0079430 A | 7/2013 |
| KR | 10-1356116 B1 | 1/2014 |

OTHER PUBLICATIONS

Cerruti, et al., "Poly(ethylene glycol) Monolayer Formation and Stability on Gold and Silicon Nitride Substrates" American Chemical Society vol. 24 (2008) pp. 10646-10653.

* cited by examiner

B - B'

B - B'

B − B'

B − B'

B - B'

B – B'

B - B'

B - B'

B - B'

B - B'

B - B'

B - B'

B - B'

B - B'

CANTILEVER SET FOR ATOMIC FORCE MICROSCOPES, SUBSTRATE SURFACE INSPECTION APPARATUS INCLUDING THE SAME, METHOD OF ANALYZING SURFACE OF SEMICONDUCTOR SUBSTRATE BY USING THE SAME, AND METHOD OF FORMING MICROPATTERN BY USING THE SAME

CROSS-REFERENCE TO RELATED APPLICATION

Korean Patent Application No. 10-2016-0009481, filed on Jan. 26, 2016, in the Korean Intellectual Property Office, and entitled: "Cantilever Set for Atomic Force Microscopes, Substrate Surface Inspection Apparatus Including the Same, Method of Analyzing Surface of Semiconductor Substrate by Using the Same, and Method of Forming Micropattern by Using the Same," is incorporated by reference herein in its entirety.

BACKGROUND

1. Field

Embodiments relate to a cantilever set for atomic force microscopes, a substrate surface inspection apparatus including the same, a method of analyzing a surface of a semiconductor substrate by using the same, and a method of forming a micropattern by using the same.

2. Description of the Related Art

As a degree of integration of semiconductor devices increases, an area occupied by each unit cell in a plan view may decrease. In response to such a reduction in the area of the unit cell, a design rule of a smaller nano-scale critical dimension (CD) ranging from several nanometers to several tens of nanometers may be applied.

SUMMARY

The embodiments may be realized by providing a method of forming a micropattern, the method including forming pinning patterns on a semiconductor substrate; forming a neutral pattern layer in spaces between the pinning patterns; and inspecting a surface of a guide layer that includes the pinning patterns and the neutral pattern layer by using an atomic force microscope (AFM).

The embodiments may be realized by providing a substrate surface inspection apparatus including a supporter capable of accommodating a substrate; a measurement unit having a cantilever and a probe tip, the probe tip being at an end of the cantilever and being capable of contacting the substrate; a driving unit capable of changing relative positions of the substrate and the probe tip; a light source unit capable of irradiating light onto the cantilever; a sensor capable of obtaining information of a surface of the substrate from light reflected by the cantilever; and a determination unit determining whether the surface of the substrate is normal from the information of the surface of the substrate sensed by sensor, wherein the probe tip includes a probe tip base having a surface modified with a polymer.

The embodiments may be realized by providing a cantilever set for an atomic force microscope (AFM), the cantilever set including a supporting frame; a cantilever fixed to the supporting frame; and a probe tip provided to an end of the cantilever, wherein the probe tip has a probe tip base with a surface that is at least partially modified with a polymer.

The embodiments may be realized by providing a method of analyzing a surface of a semiconductor substrate, the method including providing a semiconductor substrate having pinning patterns and a neutral pattern layer on the semiconductor substrate; scanning the pinning patterns or the neutral pattern layer by using a probe tip, the probe tip having a probe tip base with a surface modified with a polymer; and measuring a work of adhesion between the probe tip and the scanned pinning patterns or the scanned neutral pattern layer.

The embodiments may be realized by providing a probe tip for an atomic force microscope (AFM), the probe tip including a probe tip base; and a polymer on at least a part of a surface of the probe tip base.

BRIEF DESCRIPTION OF THE DRAWINGS

Features will be apparent to those of skill in the art by describing in detail exemplary embodiments with reference to the attached drawings in which:

FIG. 18A illustrates a plan view showing main portions for explaining the method of forming the micropattern, and FIG. 18B illustrates a cross-sectional view taken along a line B-B' of FIG. 18A;

DETAILED DESCRIPTION

Figure 1:
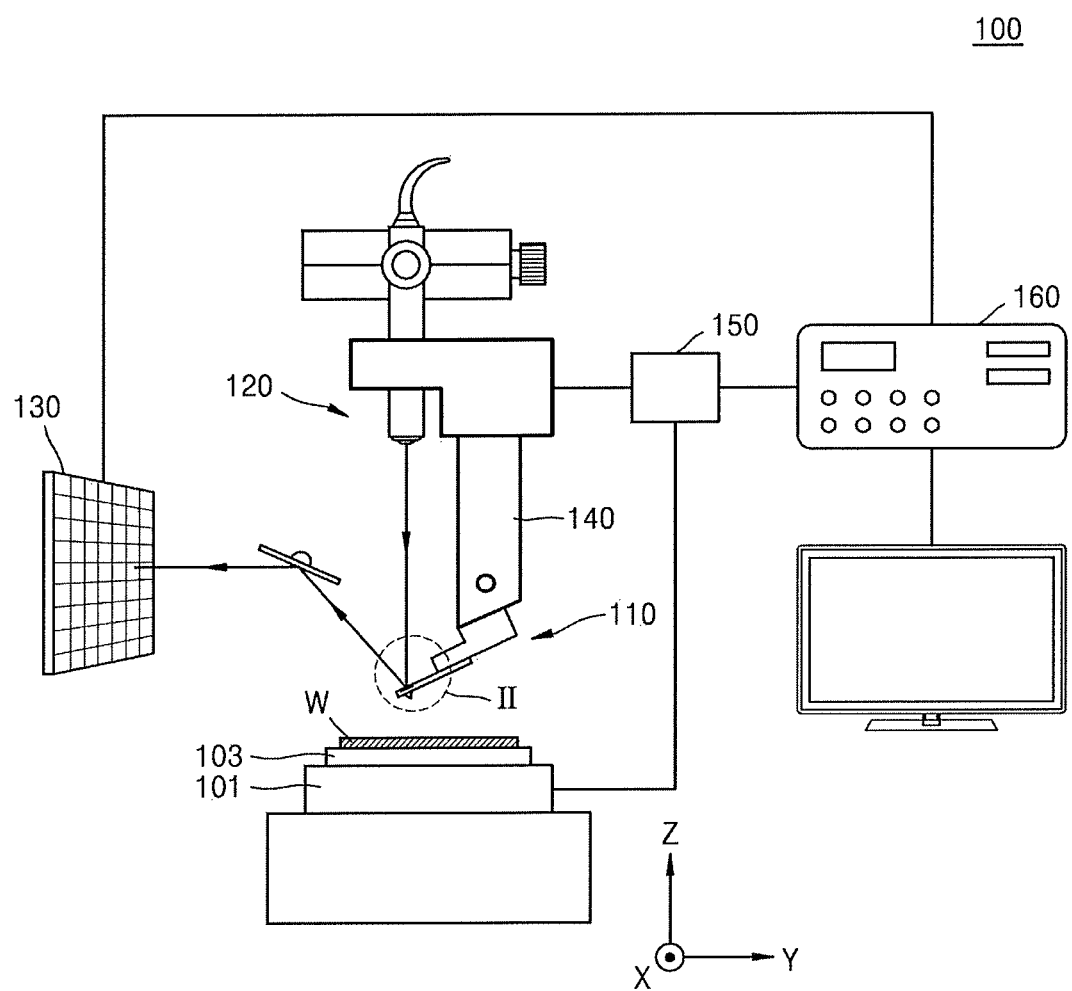
FIG. 1 illustrates a conceptual diagram of a substrate surface inspection apparatus according to an embodiment.
Figure 2:
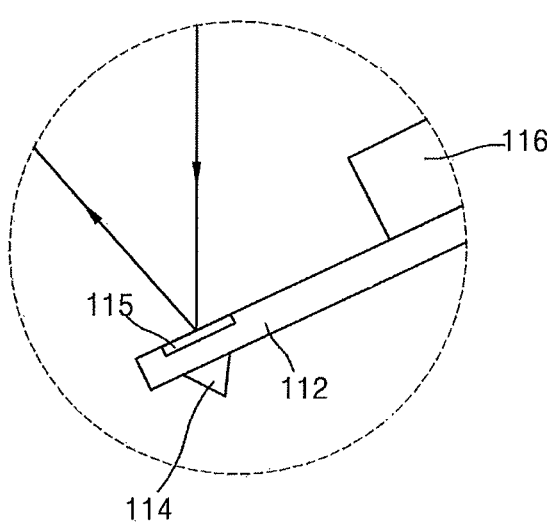
FIG. 2 illustrates a partially enlarged view of a region II of FIG. 1.

FIG. 1 illustrates a conceptual diagram of a substrate surface inspection apparatus 100 according to an embodiment. FIG. 2 illustrates a partially enlarged view of a region II of FIG. 1. The substrate surface inspection apparatus 100 may partially employ the principle of an atomic force microscope.

Referring to FIGS. 1 and 2, a supporter 103 capable of supporting a semiconductor substrate W may be provided. The supporter 103 may fix the semiconductor substrate W thereto, and may change a position of the semiconductor substrate W by moving in an X, Y, or Z direction, as needed. In addition, the supporter 103 may be rotatable with respect to at least one of the X, Y, and Z axes, as needed. The supporter 103 may be rotatable with respect to at least one of the X, Y, and Z axes, whereby a severely uneven surface of the semiconductor substrate W may be 3-dimensionally and more precisely inspected.

A measurement unit 110 may be provided above the supporter 103, the measurement unit 110 may include: a cantilever 112 capable of scanning the semiconductor substrate W; and a probe tip provided to an end of the cantilever 112. The probe tip may be formed at the end of the cantilever 112, or may be fixed to the end of the cantilever 112. The probe tip may include a probe tip base 114 with a surface modified with a polymer. This will be described in detail below with reference to FIGS. 4 to 8B.

The probe tip may cause an attractive force and/or a repulsive force with respect to a surface of the semiconductor substrate W to be inspected, whereby the cantilever 112 may be reversibly deformed or moved. For example, the attractive force may be caused by a van der Waals force between the probe tip and the surface of the semiconductor substrate W. In an implementation, the attractive force may act between the probe tip and the surface of the semiconductor substrate W by an adhesion force therebetween, and the probe tip and the surface of the semiconductor substrate W may be isolated from each other by a pull-off force or greater. If the attractive force and the repulsive force between the probe tip and the surface of the semiconductor substrate W are removed, the cantilever 112 may be restored to an initial shape thereof.

The other end of the cantilever 112 may be coupled to an actuator 116. The actuator 116 may cause a vibration of the cantilever 112. The actuator 116 may be a piezoelectric actuator or a thermal actuator. The piezoelectric actuator may be an actuator including a piezoelectric material in which an actuating displacement varies when a voltage is applied to the piezoelectric material. The thermal actuator may be an actuator including a bimetal structure in which an actuating displacement varies due to a bimetal effect when a voltage or a temperature change is applied to materials having different coefficients of thermal expansion.

Although the embodiment in which the end of the cantilever 112 is coupled to the actuator 116 is shown in FIGS. 1 and 2, the supporter 103 may have such a function of the actuator.

In addition, although the embodiment in which one cantilever 112 and one probe tip are provided is shown in FIGS. 1 and 2, two or more cantilevers 112 and two or more probe tips may be provided.

A light source unit 120 may irradiate light onto a reflector 115 at an end of the cantilever 112. The light may be, e.g., laser light. For example, the light may be light of a neodymium-doped yttrium aluminum garnet (Nd:YAG) laser or light of a Ti:sapphire laser.

The light irradiated onto the reflector 115 may be reflected by the reflector 115 and received by a sensor 130. The cantilever 112 including the reflector 115 may be deformed by or moved in response to a shape of a surface that is subjected to scanning, and the reflected light may amplify or shift in response to the deformation of the cantilever 112.

The sensor 130 may be, e.g., a photodiode (PD). Information of the surface of the semiconductor substrate W sensed by the sensor 130 may be collected and analyzed by a determination unit 160. This will be described below in more detail.

In an implementation, the supporter 103 may be arranged on a coarse stage 101.

In an implementation, the measurement unit 110 may be supported by a supporting frame 140. The supporting frame 140 and the coarse stage 101 may be connected to a driving unit 150. The driving unit 150 may be configured to control relative positions of the supporting frame 140 and the coarse stage 101. Although the coarse stage 101 is shown as being moved in the embodiment of FIG. 1, the supporting frame 140 may be moved while the coarse stage 101 is fixed, or both of the coarse stage 101 and the supporting frame 140 may be moved.

FIGS. 3A to 3D illustrate perspective views showing main portions of examples of probe tips 114a, 114b, 114c, and 114d and the cantilever 112, according to embodiments. The perspective views of the probe tips 114a, 114b, 114c, and 114d and the cantilever 112, which are shown in FIGS. 3A to 3D, are based on the situation in which the cantilever 112 and the probe tip are placed upside down.

Figure 3A:
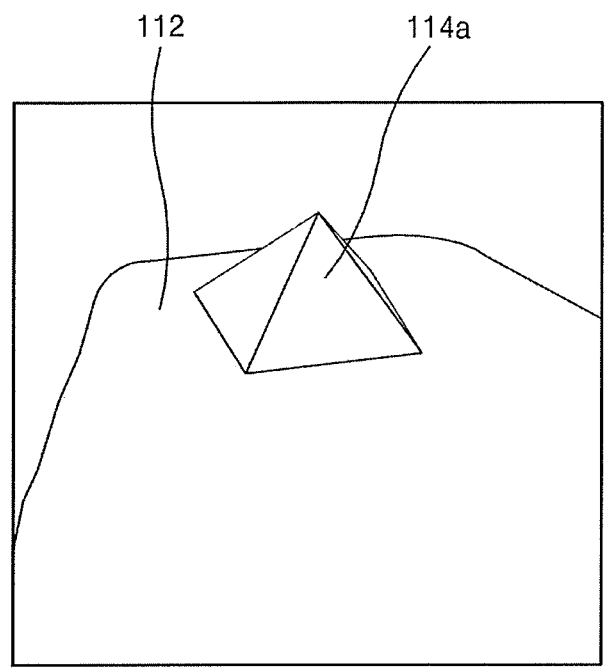
FIGS. 3A to 3D illustrate perspective views showing main portions of examples of probe tips and a cantilever, according to embodiments.

FIG. 3A shows a probe tip 114a having a general pyramid shape. Although easily manufactured, the probe tip 114a may provide a low resolution when a high aspect ratio surface is scanned by the probe tip 114a.

Figure 3B:
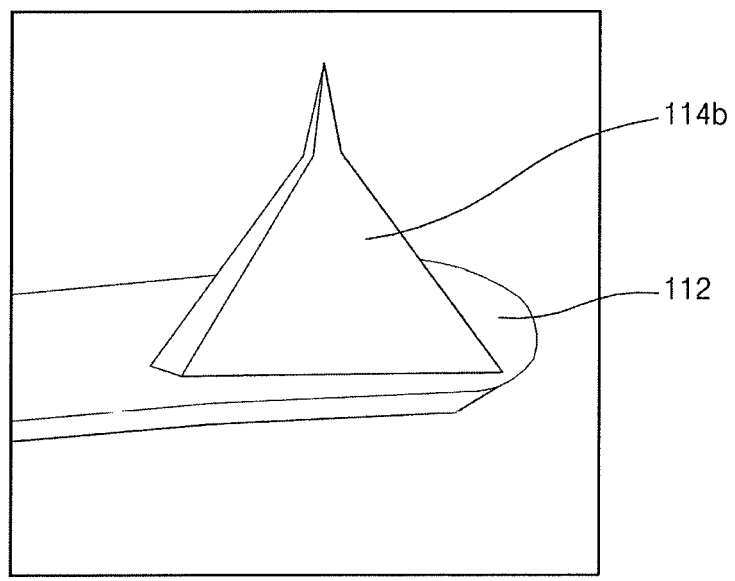

FIG. 3B shows a probe tip 114b having a shape of a super tip in which a sharp end portion is added to a top end of a pyramid shape.

Figure 3C:
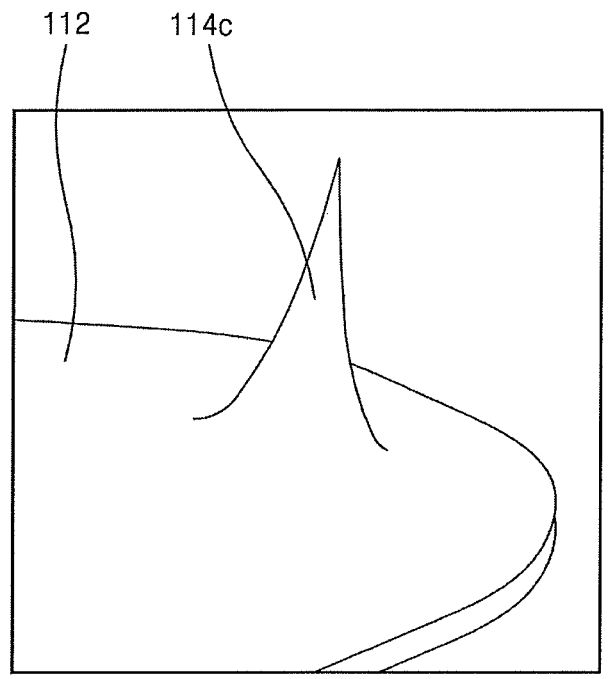

FIG. 3C shows a probe tip 114c having a shape of an ultralever which has a thorn shape having a concave side cross-section.

Figure 3D:
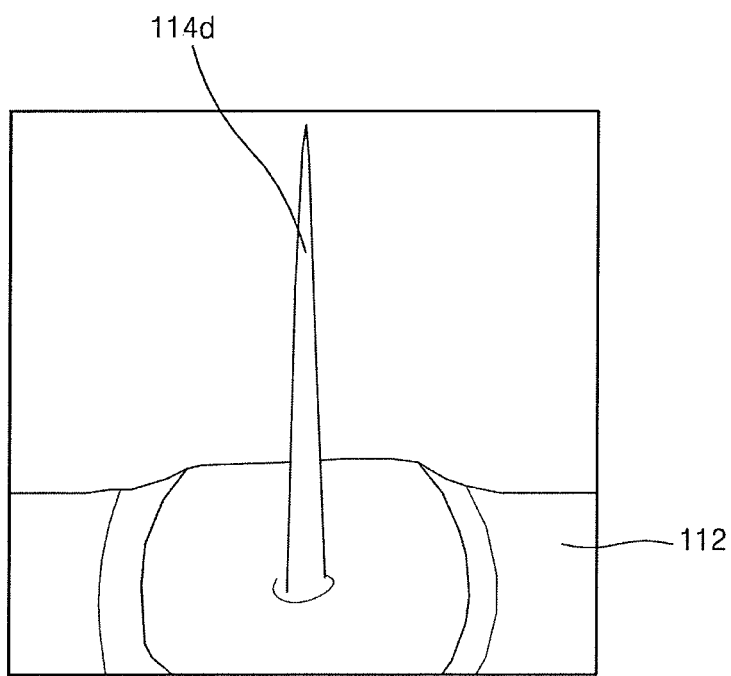

FIG. 3D shows a probe tip 114d having an end that is sharpened by a focused ion beam (FIB).

Although the probe tips 114b, 114c, and 114d respectively shown in FIGS. 3B to 3D may result in a high resolution, the fabrication thereof may be difficult, and the probe tips 114b, 114c, and 114d may be damaged.

Although the probe tip 114a shown in FIG. 3A will be described hereinafter, it will be understood by those of ordinary skill in the art that the same principle may also be applied to the probe tips 114b, 114c, and 114d of FIGS. 3B to 3D.

Figure 4:
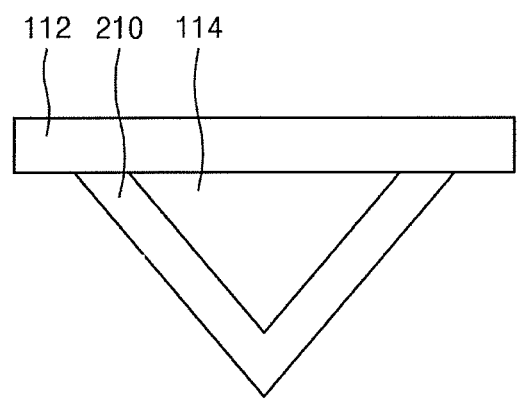
FIG. 4 illustrates a conceptual diagram showing an end of a cantilever and a surface of a probe tip, according to an embodiment.

FIG. 4 illustrates a conceptual diagram showing the end of the cantilever 112 and a surface of the probe tip, according to an embodiment.

Referring to FIG. 4, a surface of the probe tip base 114 may be modified with a polymer layer 210. The polymer layer 210 may at least partially cover the surface of the probe tip base 114. In an implementation, the polymer layer 210 may cover the entire surface of the probe tip base 114.

The polymer layer 210 may include, e.g., polystyrene (PS), polymethylmethacrylate (PMMA), poly(ethylene oxide) (PEO), polydimethylsiloxane (PDMS), poly(4-vinylpyridine) (P4VP), poly(2-vinylpyridine) (P2VP), poly (lactic acid) (PLA), polyisoprene (PI), or copolymers thereof.

In an implementation, the polymer layer 210 may be variously configured depending upon materials used for the preparation thereof, formation methods thereof, and the like.

FIGS. 5 to 8B illustrate conceptual side cross-sectional views showing configurations of the surface of the probe tip depending upon fabrication methods.

Figure 5:
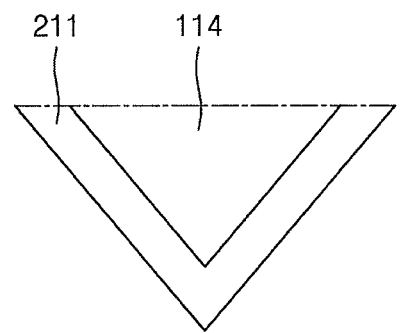
FIGS. 5 to 8B illustrate conceptual side cross-sectional views showing configurations of a surface of a probe tip according to a fabrication method.

Referring to FIG. 5, a simply coated polymer layer 211 may be provided to the surface of the probe tip base 114. Here, the polymer layer 211 and the probe tip base 114 may be bonded to each other by a physical bond and/or a chemical bond, e.g., by a van der Walls force. When the polymer layer 211 is formed by a method such as dip coating or the like, the polymer layer 211 and the probe tip base 114 may be bonded to each other by adhesion, which is a kind of physical bond. In the embodiment shown in FIG. 5, a covalent bond between the polymer layer 211 and the probe tip base 114 may not be present.

In an implementation, the polymer layer 211 may have a thickness of about 10 nm to about 1,000 nm.

In an implementation, the polymer layer 211 may be formed by a method such as dip coating, spray coating, or the like. For this purpose, a polymer solution, in which a polymer (or polymers) constituting the polymer layer 211 is dissolved in a solvent, may be provided. The solvent for the preparation of the polymer solution may be, e.g., benzene, toluene, xylene, propylene glycol monomethyl ester acetate (PGMEA), propylene glycol monomethyl ester (PGME), ethyl-3-ethoxy propionate (EEP), ethyl lactate (EL), methyl 2-hydroxybutyrate (HBM), gamma-butyrolactone (GBL), or the like.

Hereinafter, embodiments will be described with reference to the drawings, with an emphasis on configurations of the polymer layer 211 depending upon formation methods thereof.

Figure 6A:
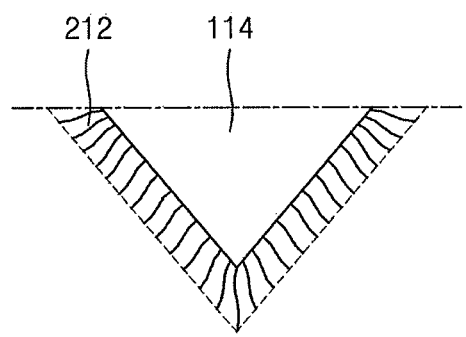

Referring to FIG. 6A, the surface of the probe tip base 114 may be modified with a polymer moiety which is bonded to the surface of the probe tip base 114 by a covalent bond. The polymer moiety may be bonded to a certain area of the probe tip 114, and the polymer moiety may form a polymer layer 212.

To form the polymer layer 212, the probe tip base 114 may be treated in an atmosphere activated by ultraviolet light and ozone. The probe tip base 114 may include various materials, e.g., a silicon (Si)-based material such as Si, $SiO_2$, or $Si_3N_4$. In this case, by an ultraviolet/ozone (UVO) treatment, the probe tip base 114 may be terminated by a hydroxyl group (—OH) simultaneously with removal of impurities of the surface of the probe tip base 114. The hydroxyl group may be bonded to a silicon atom, which is a main material of the probe tip base 114. In an implementation, a carboxyl group (—COOH), an amine group (—NH$_2$), a sulfhydryl or thiol group (—SH), an epoxy group, or the like may be used instead of the hydroxyl group.

A polymer material for forming the polymer layer 212 may be a polymer material having a functional group capable of chemically reacting with the hydroxyl, carboxyl, amine, sulfhydryl, or epoxy group at an end of the polymer material, e.g., a polymer material having a hydroxyl group (—OH), an amine group, or a carboxyl group (—COOH) as a functional group at an end of the polymer material. In an implementation, the polymer material may include polystyrene, PMMA, PEO, PLA, polyisoprene, or copolymers thereof such as PS-r-PMMA.

Figure 6B:
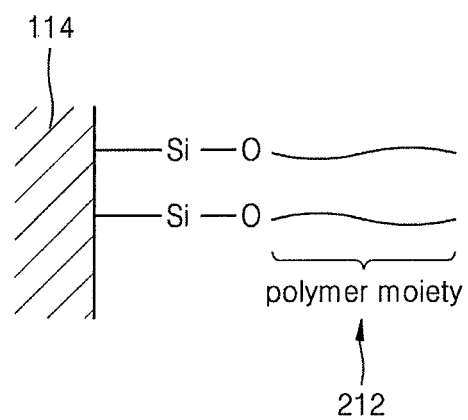

The functional group capable of chemically reacting with the hydroxyl group may react with the hydroxyl group on the surface of the probe tip base 114 and thus may remain as an ether group, an ester group, an amine group, or the like. In addition, the polymer material may be bonded to the surface of the probe tip base 114 and thus may form the polymer layer 212. FIG. 6B illustrates a conceptual diagram showing the polymer layer 212 formed on the surface of the probe tip base 114 in such a manner.

Figure 6C:
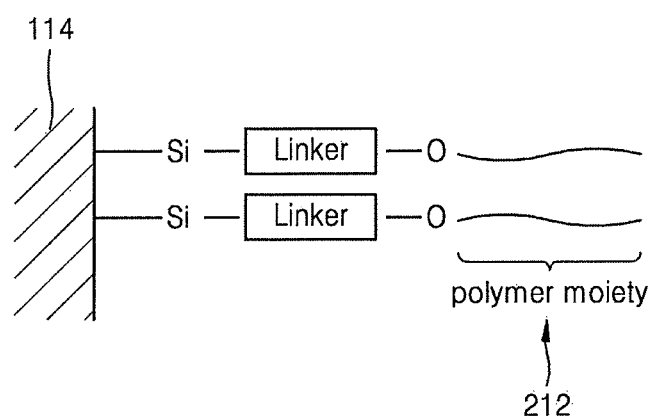

FIG. 6C illustrates a conceptual diagram showing the polymer layer 212 according to another embodiment.

In the polymer layer 212 of FIG. 6C, a polymer moiety may be bonded to the surface of the probe tip base 114 via an intervening linker.

The linker may be a polymer having a hydroxyl, carboxyl, amine, sulfhydryl, epoxy group, or the like at an end of the polymer, e.g., polyethylene glycol (PEG), polypropylene glycol (PPG), polycaprolactone, polylactic acid, or the like. These polymers may have a degree of polymerization of about 100 to about 10,000.

A polymer for forming the polymer moiety may have a functional group capable of reacting with and being bonded to the hydroxyl, carboxyl, amine, sulfhydryl group, or the like, which is provided to the end of the linker. For example, the polymer for forming the polymer moiety may have a hydroxyl group or a carboxyl group.

As such, when the polymer moiety in the polymer layer 212 is bonded to the surface of the probe tip base 114 via the intervening linker, mobility allowing the polymer moiety to be movable may be imparted to the polymer moiety. Thus, the polymer moiety may more freely interact with the surface of the substrate, and a loss of the polymer moiety due to contact may be reduced.

Figure 7A:
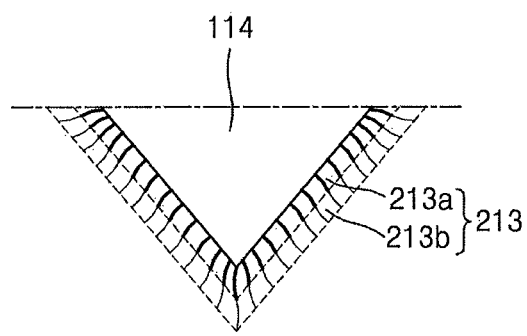
Figure 7B:
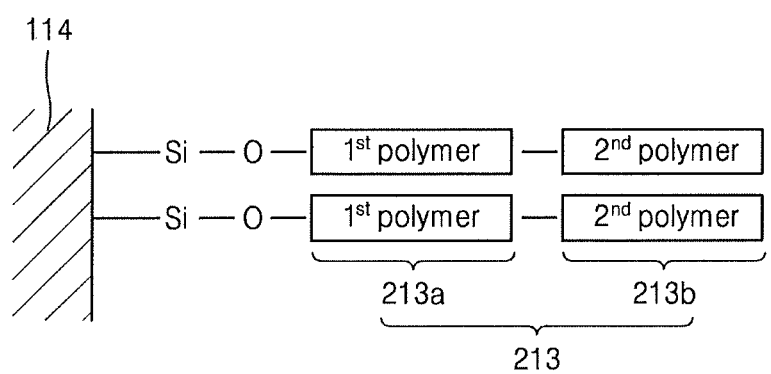

FIG. 7A illustrates a conceptual diagram showing the probe tip according to another embodiment. FIG. 7B illustrates a conceptual diagram specifically showing a situation in which a polymer moiety is bonded to the surface of the probe tip base 114.

Referring to FIGS. 7A and 7B, a polymer layer 213 may be provided onto the surface of the probe tip base 114, the polymer layer 213 being formed by bonding the polymer moiety to the surface of the probe tip base 114.

In an implementation, the polymer moiety of the same kind may be bonded to the surface of the probe tip base 114. In an implementation, the polymer moiety may be a block copolymer of a first polymer moiety 213a and a second polymer moiety 213b. For example, the polymer moiety may be prepared by anionic polymerization, whereby the length of each of the first polymer moiety 213a and the second polymer moiety 213b may be substantially constant. For example, the first polymer moieties 213a (of the polymer moieties formed on the entire surface of the probe tip base 114) may have substantially constant lengths. In addition, the second polymer moieties 213b (of the polymer moieties formed on the entire surface of the probe tip base 114) may have substantially constant lengths. The lengths of the first and second polymer moieties 213a and 213b may be precisely controlled, e.g., by anionic polymerization.

In an implementation, one of the first polymer moiety 213a and the second polymer moiety 213b may be hydrophilic, and the other one may be hydrophobic. The first polymer moiety 213a and the second polymer moiety 213b may have different properties, and if the second polymer moiety 213b is selectively removed, the surface of the substrate having various properties may be inspected by using various means.

In an implementation, the first polymer moiety 213a and the second polymer moiety 213b may be selectively decomposed by an alcohol solvent. The first polymer moiety 213a may be a polymer moiety having a polystyrene repeating unit, and the second polymer moiety 213b may be a polymer moiety having a repeating unit of PMMA. In this case, when the second polymer moiety 213b is subjected to deep ultraviolet (DUV) irradiation, the first polymer moiety 213a may be selectively dissolved by an alcohol solvent, e.g., isopropyl alcohol.

In an implementation, the first polymer moiety 213a and the second polymer moiety 213b may be selectively dissolved by acetic acid.

In an implementation, materials of the first polymer moiety 213a and the second polymer moiety 213b may be selected such that the first polymer moiety 213a and the second polymer moiety 213b have an etch selectivity upon etching by oxygen. For example, the materials of the first polymer moiety 213a and the second polymer moiety 213b may be selected such that the first polymer moiety 213a and the second polymer moiety 213b have an etch selectivity upon dry etching using oxygen plasma. The first polymer moiety 213a may be a polymer moiety having a polystyrene repeating unit, and the second polymer moiety 213b may be a polymer moiety having a repeating unit of PMMA. In this case, the second polymer moiety 213b may be selectively decomposed by oxygen as compared with the first polymer moiety 213a. In this case, the first polymer moiety 213a having the polystyrene repeating unit may have an oxidized surface-functional group.

When the first polymer moiety 213a needs to be used while the second polymer moiety 213b is used for inspecting the surface of the semiconductor substrate, the second polymer moiety 213b may be removed by DUV irradiation and by etching using an alcohol solvent or an acid (wet etching) or using oxygen (dry etching) even without separately replacing the probe tip, whereby the probe tip having the first polymer moiety 213a on the surface of the probe tip base 114 may be easily obtained.

As described above, the first polymer moiety 213a and the second polymer moiety 213b may have different properties, the second polymer moiety 213b bonded to an end of the probe tip base 114 may be used for a surface for which use of the second polymer moiety 213b is more suitable, and the first polymer moiety 213a remaining after removal of the second polymer moiety 213b may be used for inspecting a surface for which use of the first polymer moiety 213a is more suitable.

Although the block copolymer is shown as being a di-block copolymer having two blocks, block copolymers having two or more blocks, e.g., tri-block copolymers or tetra-block copolymers, may also be used, as desired. In an implementation, star-shaped block copolymers may also be used.

Figure 8A:
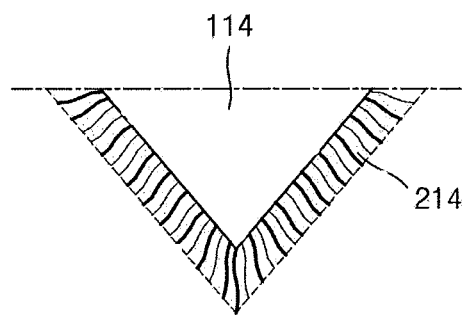
Figure 8B:
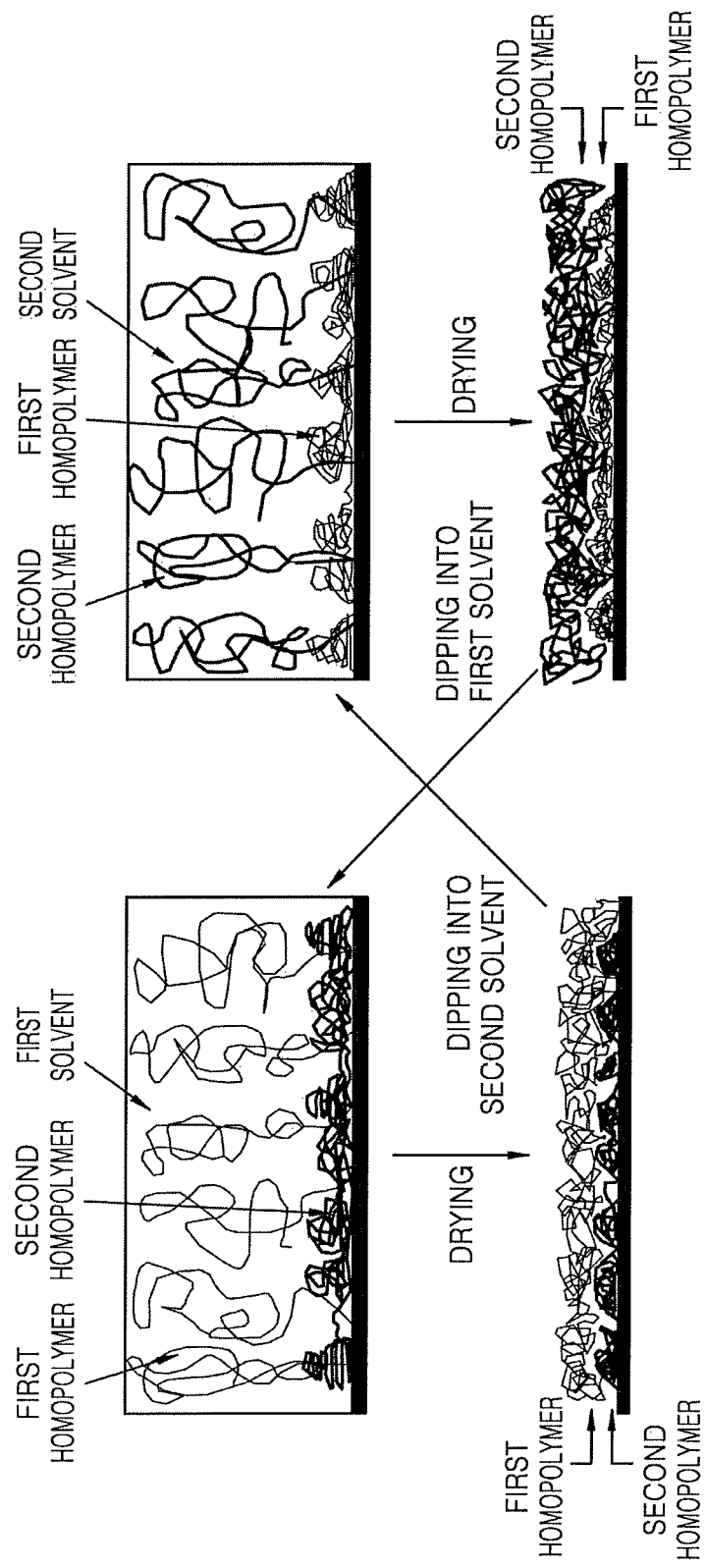

FIG. 8A illustrates a conceptual diagram showing the probe tip according to a further embodiment. FIG. 8B illustrates a conceptual diagram for explaining a method of activating a homopolymer having specific properties by dipping the probe tip into a specific solvent, as desired.

Referring to FIGS. 8A and 8B, a polymer layer 214 may be provided onto the surface of the probe tip base 114, the polymer layer 214 being formed by bonding each of two homopolymers to the surface of the probe tip base 114 by a covalent bond. The two homopolymers may be polymers having different properties. The two homopolymers may be randomly distributed on the surface of the probe tip base 114.

In an implementation, a first homopolymer, which is one of the two homopolymers, may be hydrophilic, and a second homopolymer, which is the other one, may be hydrophobic. For example, the first homopolymer may be PMMA, PEO, PLA, polyisoprene, or the like. For example, the second homopolymer may be polystyrene.

When both of the two homopolymers are bonded to the surface of the probe tip base 114, it may be difficult to precisely inspect the surface of the substrate in the case that both of the two homopolymers are activated. Therefore, only a desired one of the two homopolymers may be activated, as desired. For example, only a desired one of the two homopolymers may be activated at one time. For this purpose, a solvent having miscibility with one or each of the two homopolymers may be used.

For example, as shown in FIG. 8B, if the polymer layer 214 is dipped into a first solvent having strong miscibility with the first homopolymer, the first homopolymer may be activated and swollen, and the second homopolymer (having low affinity with the first solvent) may be entangled on and remain close to the surface of the probe tip base 114. Here, if removal of the first solvent and drying are performed, the second homopolymer may be directly located on or close to the surface of the probe tip base 114, and the first homopolymer (outside the second homopolymer) may be exposed. As a result, the first homopolymer may be formed or be present at the outermost side of the polymer layer 214, and this configuration may be used when the surface of the substrate is inspected by using the probe tip modified with the first homopolymer.

On the other hand, when the second homopolymer needs to be formed or present at the outermost side of the polymer layer 214, a second solvent having strong miscibility with the second homopolymer may be used. If the polymer layer 214 is dipped into the second solvent, the second homopolymer may be activated and swollen, and the first homopolymer (having low affinity with the second solvent) may be entangled on and remain close to the surface of the probe tip base 114. Here, if removal of the second solvent and drying are performed, the first homopolymer may be directly located on or close to the surface of the probe tip base 114, and the second homopolymer outside the first homopolymer may be exposed. As a result, the second homopolymer may be formed at the outermost side of the polymer layer 214, and this configuration may be used when the surface of the substrate is inspected by using the probe tip modified with the second homopolymer.

In an implementation, the first solvent may include, e.g., water, methanol, ethanol, isopropyl alcohol, acetone, ammonia, acetic acid, dimethyl sulfoxide (DMSO), acetonitrile, tetrahydrofuran (THF), 1,4-dioxane, dimethylformamide (DMF), formic acid, or the like.

In an implementation, the second solvent may include, e.g., benzene, toluene, xylene, carbon tetrachloride, n-methyl pyrrolidone (NMP), cyclohexane, chloroform, dimethyl carbonate, methyl ethyl ketone (MEK), diethyl ether, ethyl acetate, or the like.

An atomic force microscope shown in FIGS. 1 and 2 may include the probe tip having the surface that is modified as described with reference to FIGS. 5 to 8B. In an implementation, the atomic force microscope may be used as an apparatus for inspecting or analyzing the surface of the semiconductor substrate W, and a method of inspecting the surface of the semiconductor substrate by using the atomic force microscope will be described hereinafter.

Figure 9:
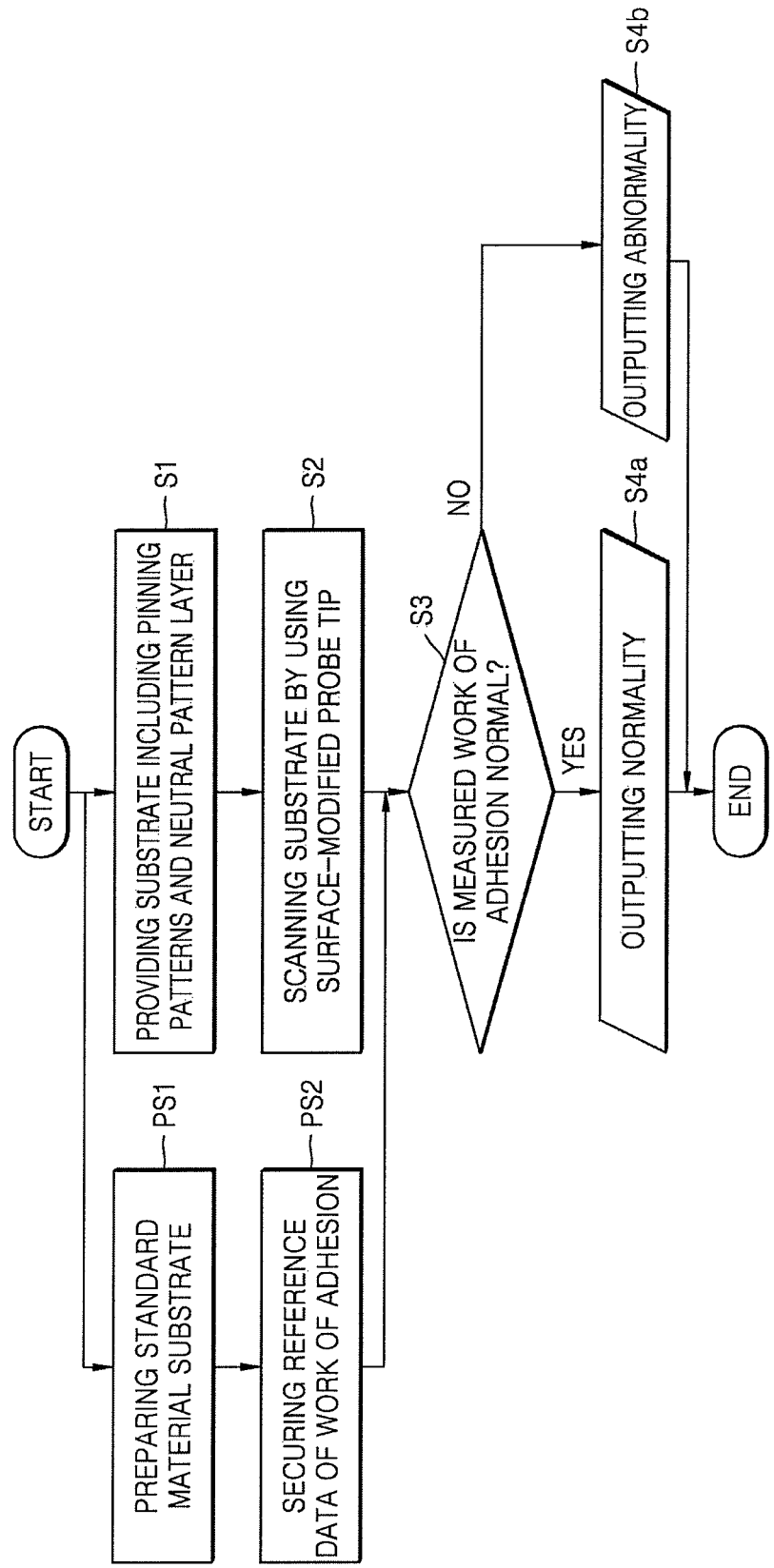
FIG. 9 illustrates a flowchart of a method of inspecting a surface of a semiconductor substrate according to a process order of the method.
Figure 10:
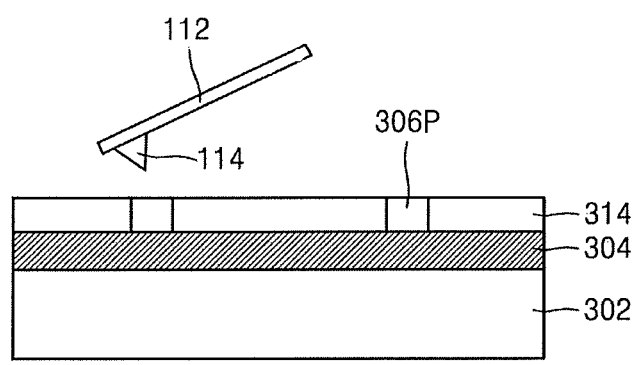
FIG. 10 illustrates a side cross-sectional view of a stage in a method of inspecting a surface of a semiconductor substrate.

FIG. 9 illustrates a flowchart of a method of inspecting a surface of a semiconductor substrate according to a process order of the method. FIG. 10 illustrates a side cross-sectional view for conceptually explaining the method of inspecting the surface of the semiconductor substrate.

Referring to FIGS. 9 and 10, a substrate 302 may be provided, the substrate 302 including a surface to be inspected, e.g., pinning patterns 306P and a neutral pattern layer 314 (S1). These will be described below with reference to FIGS. 11A to 13B.

Next, to inspect surfaces of the pinning patterns 306P and/or the neutral pattern layer 314, the surfaces may be scanned by using the probe tip (S2). The probe tip may scan the surfaces of the pinning patterns 306P and/or the neutral pattern layer 314 in a contact manner, a non-contact manner, and/or a tapping manner.

As will be described below in detail, the pinning patterns 306P and the neutral pattern layer 314 may include a polymer material, and a force, which acts between the probe tip and the pinning patterns 306P or between the probe tip and the neutral pattern layer 314, may be reasonably modeled by the Johnson-Kendall-Roberts (JKR) theory. According to the JKR theory, the force F acting between the probe tip and the surfaces to be inspected may be modeled by Equation 1.

$$F=(3/2)\pi RW \quad \text{[Equation 1]}$$

In Equation 1, R is a radius of curvature of the end of the probe tip, and W is a work of adhesion between the probe tip and the surfaces to be inspected, the work of adhesion representing energy per unit area.

To determine whether the surfaces of the pinning patterns 306P and the neutral pattern layer 314 are normal by using a value of the work of adhesion W, which is calculated by using Equation 1, a reference value for comparison with the value may be secured or determined.

To determine the reference value, a standard material substrate having a material on a surface thereof may be prepared, the material being the same as the pinning patterns 306P or the neutral pattern layer 314 (PS1). For example, the standard material substrate having a uniform single layer of the material on the standard material substrate may be separately fabricated, the material being the same as the pinning patterns 306P or the neutral pattern layer 314.

Next, the surface of the standard material substrate may be scanned by using the probe tip, whereby a value of the force or a range of the value may be measured, the force acting between the probe tip and the material of the pinning patterns 306P or the neutral pattern layer 314. A range of the reference value may be obtained by performing the measurement of the value a plurality of times (PS2).

For example, the reference value for the work of adhesion between a probe tip modified with PS and a surface of PS may range from about 58 $mJ/m^2$ to about 68 $mJ/m^2$.

For example, the reference value for the work of adhesion between a probe tip modified with PMMA and a surface of PMMA may range from about 71 $mJ/m^2$ to about 76 $mJ/m^2$.

For example, the reference value for the work of adhesion between a probe tip modified with PS-r-PMMA (PS: PMMA=7:3) and a surface of PS-r-PMMA (PS:PMMA=7:3) may range from about 60 $mJ/m^2$ to about 67 $mJ/m^2$.

The reference value may not be measured every time the surface inspection is performed. However, the range of the reference value may be affected by the spring constant of a cantilever in use, the radius of curvature of the end of the probe tip, the temperature and humidity during the measurement, and the like, and if these parameters are changed, a different reference value may be derived. Therefore, if the conditions for the surface inspection are different from the conditions upon obtaining the reference value, a new reference value may be determined.

The work of adhesion between the probe tip and the surfaces of the pinning patterns 306P and the neutral pattern layer 314 obtained by the scanning in operation S2 may be compared with the reference value obtained above, whereby whether the work of adhesion is normal is determined (S3). In an implementation, the determination may be performed as follows: if the value obtained by the scanning falls within the range of the reference value, the value is determined as being normal, and if the value obtained by the scanning is out of the range of the reference value, the value is determined as being abnormal. In an implementation, the determination may be performed as follows: the range of the reference value may be allowed to have a certain tolerance range, and if the value obtained by the scanning falls within the range of the reference value or the tolerance range, the value may be determined as being normal. Whether the surfaces are normal may be determined in various methods by taking into account measurement conditions.

If the value obtained by the scanning is determined as being normal, while the result that the value is normal is output (S4a), another portion of the surfaces of the pinning patterns 306P or the neutral pattern layer 314 may be further inspected, or a subsequent process may be further performed.

If the value obtained by the scanning is determined as being abnormal, while the result that the value is abnormal is output (S4b), the value may be stored in a storage device, or a subsequent action (e.g., disposal of the substrate) due to the occurrence of surface abnormality may be performed.

Instead of directly inspecting a surface, on which a micropattern is formed, by using an atomic force microscope, a droplet of a liquid may be formed on the surface, and whether the surface is normal may be determined by using a contact angle between the droplet and the surface.

For example, the following method has been used. After the pinning patterns 306P or the neutral pattern layer 314 is formed, a material substrate may be separately fabricated by the same method as a method of forming the pinning patterns 306P (or a method of forming the neutral pattern layer 314, when the neutral pattern layer 314 is intended to be inspected), and the contact angle of the droplet on the material substrate is measured. Next, if the measured contact angle of the droplet falls within a desired range, it is inferred that the pinning patterns 306P (or the neutral pattern layer 314, when the neutral pattern layer 314 is intended to be inspected) have been normally formed.

The reason for doing so is that although the size of the droplet for measuring the contact angle may be at a level of several micrometers even though the droplet is formed as small as possible, the size of the pattern may be no more than several tens of nanometers.

As a result, direct inspection of the pinning patterns 306P or the neutral pattern layer 314 may not be performed, the pinning patterns 306P or the neutral pattern layer 314 being actually obtained in a semiconductor fabrication process.

In addition, with the trend of forming finer patterns, although heterogeneous components for finely adjusting properties of the pinning patterns 306P or the neutral pattern layer 314 may be added, there is a limit in that an extremely small change of the properties due to the addition of the heterogeneous components is not detected by the general method.

For example, when PS is selected as the neutral pattern layer 314, hydroxyethyl methacrylate (HEMA), as a heterogeneous component for finely adjusting properties of PS, may be copolymerized with PS in a certain ratio. However, it may be difficult to find a difference depending upon an amount of HEMA by measuring the contact angle, as shown in Table 1. A significant difference was found depending upon the amount of HEMA when the work of adhesion was directly measured by using an atomic force microscope, and it was confirmed that the method of inspecting the surface of the substrate by using the atomic force microscope could allow the surface of the substrate to be more precisely inspected than the other method.

TABLE 1

| Amount of HEMA in PS | Contact angle of water droplet (degree) | Work of adhesion (mJ/m$^2$) |
| --- | --- | --- |
| 2 mol % | 86.54 | 83.12 |
| 1 mol % | 86.26 | 66.79 |
| 0.5 mol % | 86.77 | 60.83 |

In addition, surface properties of a polymer layer on the surface of the substrate may be significantly changed as the polymer layer was subjected to a photolithography process.

For example, the work of adhesion was measured in each of the case that a crosslinked PMMA layer was formed on the surface of the substrate (Example 1), the case that the PMMA layer of Example 1 was subjected to a photolithography process (Example 2), the case that a random copolymer of the same material as the neutral pattern layer 314 was coated onto the surface of the substrate and then subjected to a photolithography process (Example 3), and the case that the pinning patterns 306P (PMMA component) and the neutral pattern layer 314 (PS component) as shown in FIG. 10 were formed (Example 4).

Here, a probe tip modified with PS or PMMA by using a PEG linker (silane-PEG-COOH) was used, the PEG linker including a PEG moiety having a degree of polymerization of about 5,000.

As shown in Table 2, below, for comparison, when the works of adhesion were respectively measured on PMMA of the pinning pattern (Example 4) and on PMMA after the photolithography process (Example 2) by using the probe tip modified with PMMA, it may be seen that the works of adhesion respectively had values of 68.86 and 73.74, and that there was a significant difference therebetween.

In addition, for comparison, when the works of adhesion were respectively measured on PS of the neutral pattern layer (Example 4) and on PS after the photolithography process (Example 3) by using the probe tip modified with PMMA, it may be seen that the works of adhesion respectively had values of 81.70 and 100.80, and that there was a significant difference therebetween.

Therefore, to precisely analyze surface properties of the pinning patterns and the neutral pattern layer, it may be seen that performing surface analysis by using the atomic force microscope, as described herein, would be desirable.

TABLE 2

| | Inspection target | | Measurement of work of adhesion by using probe tip modified with PS (mJ/m$^2$) | Measurement of work of adhesion by using probe tip modified with PMMA (mJ/m$^2$) |
| --- | --- | --- | --- | --- |
| Example 1 | Croslinked PMMA | | — | 85.14 |
| Example 2 | PMMA after photolithography process | | — | 73.74 |
| Example 3 | PS after photolithography process | | 63.45 | 100.80 |
| Example 4 | Pinning pattern (PMMA) | | 62.60 | 68.86 |
| | Neutral pattern layer (PS) | | 62.71 | 81.70 |

Figure 11A:
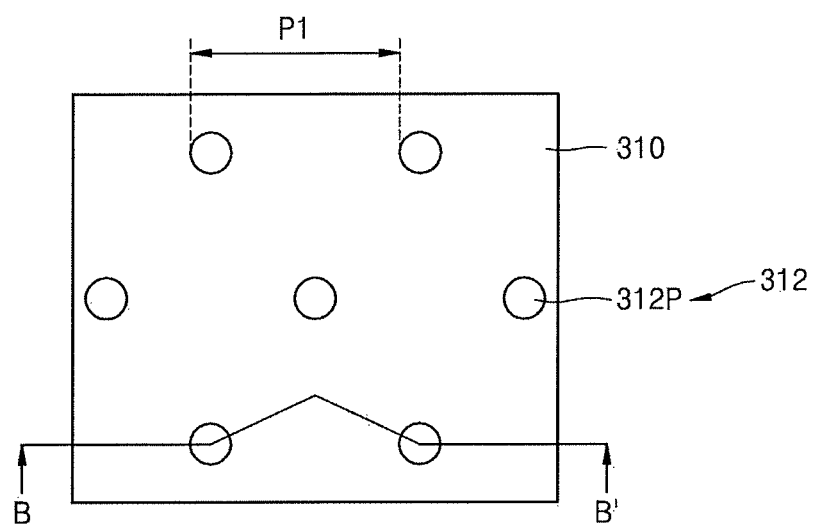
FIGS. 11A to 17B illustrate diagrams showing stages in a method of forming a micropattern according to a process order, according to an embodiment, FIGS. 11A, 12A, . . . , and 17A illustrate plan views showing main portions for explaining the method of forming the micropattern, and FIGS. 11B, 12B, . . . , and 17B illustrate cross-sectional views taken along lines B-B' of FIGS. 11A, 12A, . . . , and 17A, respectively.

FIGS. 11A to 17B illustrate diagrams showing a method of forming a micropattern according to a process order, according to an embodiment. FIGS. 11A, 12A, . . . , and 17A illustrate plan views showing main portions for explaining the method of forming the micropattern. FIGS. 11B, 12B, . . . , and 17B Illustrate cross-sectional views taken along lines B-B' of FIGS. 11A, 12A, . . . , and 17A, respectively.

Figure 11B:
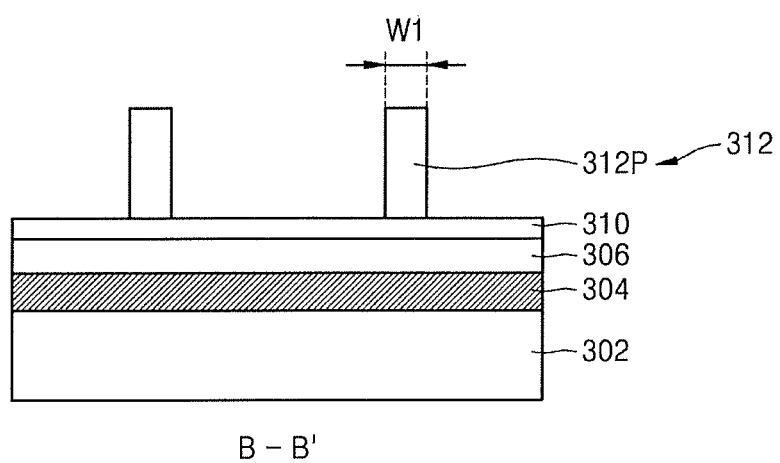

Referring to FIGS. 11A and 11B, an etching target layer 304 may be formed on a substrate 302, and a pinning material layer 306 may be formed on the etching target layer 304.

The substrate 302 may include a semiconductor substrate. In an implementation, the substrate 302 may include a semiconductor such as Si or Ge. In an implementation, the substrate 302 may include a compound semiconductor such as SiGe, SiC, GaAs, InAs, or InP. In an implementation, the substrate 302 may have a silicon-on-insulator (SOI) structure. The substrate 302 may include a conductive region, e.g., an impurity-doped well, or an impurity-doped structure. In an implementation, the substrate 302 may have various device isolation structures such as a shallow trench isolation (STI) structure.

The etching target layer 304 may be an insulating layer or a conductive layer. For example, the etching target layer 304 may include a metal, an alloy, a metal nitride, a metal oxynitride, a metal oxycarbide, a semiconductor, polysilicon, an oxide, a nitride, an oxynitride, a hydrocarbon compound, or combinations thereof. When a pattern intended to be finally formed is realized on the substrate 302, the etching target layer 304 may be omitted.

In an implementation, the pinning material layer 306 may be a polymer material layer. For example, the pinning material layer 306 may be a crosslinkable and hydrophilic polymer material layer. In an implementation, the pinning material layer 306 may include crosslinked PMMA.

A crosslinking agent may be used for the crosslinking of PMMA. The crosslinking agent which may be used for the crosslinking of PMMA may include a di-, tri-, tetra-, or more-functional ethylene unsaturated monomer. For example, the crosslinking agent may include trivinylbenzene, divinyltoluene, divinylpyridine, divinylnaphthalene, divinylxylene, ethyleneglylcol diacrylate, trimethylolpropane triacrylate (TMPTA), diethyleneglylcol divinyl ether, trivinylcyclohexane, allyl methacrylate (ALMA), ethyleneglylcol dimethacrylate (EGDMA), diethyleneglylcol dimethacrylate (DEGDMA), prophyleneglylcol dimethacrylate, prophyleneglylcol diacrylate, trimethylolpropane trimethacrylate (TMPTMA), divinylbenzene (DVB), glycidyl methacrylate, 2,2-dimethylpropane-1,3-diacrylate, 1,3-butylene glycol diacrylate, 1,3-butylene glycol dimethacrylate, 1,4-butandiol diacrylate, diethylene glycol diacrylate, diethylene glycol dimethacrylate, 1,6-hexanediol diacrylate, 1,6-hexanediol dimethacrylate, tripropylene glycol diacrylate, tripropylene glycol dimethacrylate, tetraethylene glycol diacrylate, tetraethylene glycol dimethacrylate, ethoxylated bisphenol A diacrylate, ethoxylated bisphenol A dimethacrylate, pentaerythritol triacrylate, trimethylolpropane triethoxy triacrylate, glyceryl propoxy triacrylate, pentaerythritol tetracrylate, pentaerythritol tetramethacrylate, dipentaerythritol monohydroxypentacrylate, ethoxylated diacrylate, ethoxylated triacrylate, ethoxylated TMPTA, ethoxylated TMPTMA, ethoxylated tetraacrylate, divinyl silane, tirvinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, glycosyl urea including di-, tri- and tetra-glycosyl urea, epoxy, or mixtures thereof.

An anti-reflective layer 310 may be formed on the pinning material layer 306, and a mask pattern 312 including a plurality of pillars 312P may be formed on the anti-reflective layer 310.

The anti-reflective layer 310 may be any anti-reflective layer suitable for photolithography processes. In an implementation, the anti-reflective layer 310 may include a Si-containing material. In an implementation, the anti-reflective layer 310 may include a silicon oxynitride layer. In an implementation, the anti-reflective layer 310 may include an organic anti-reflective coating (ARC) material for KrF excimer lasers, ArF excimer lasers, ArF-immersion (ArF-i), or other suitable light sources.

In an implementation, the anti-reflective layer 310 may have a thickness of about 20 nm to about 500 nm.

The plurality of pillars 312P formed as the mask pattern 312 may be arranged in a regular shape. For example, the plurality of pillars 312P may be arranged in a hexagonal array or a matrix array.

In an implementation, each of the plurality of pillars 312P may have a diameter that is 0.5 times to 1.5 times a bulk cycle $L_0$ of a block copolymer layer 320 described with reference to FIGS. 14A and 14B. For this purpose, a width W1 of each of the plurality of pillars 312P formed as the mask pattern 312 described with reference to FIGS. 11A and 11B may be adjusted. Details of the bulk cycle $L_0$ will be described below with reference to FIGS. 15A and 15B.

The plurality of pillars 312P may have a first pitch P1, which is at least 1.5 times the bulk cycle $L_0$ of the block copolymer layer 320 described with reference to FIGS. 14A and 14B. The plurality of pillars 312P may be arranged in a hexagonal array having the first pitch P1 that is at least 1.5 times the bulk cycle $L_0$ of the block copolymer layer 320.

In an implementation, the plurality of pillars 312P may be arranged in a hexagonal array having the first pitch P1 that is about 1.73 times the bulk cycle $L_0$ of the block copolymer layer 320. In this case, as will be described with reference to FIGS. 15A and 15B, each of a plurality of first domains 320A may have a cylindrical shape and be self-aligned to be located in a central portion of three adjacent pillars 312P among the plurality of pillars 312P, the plurality of first domains 320A being formed by a phase separation process of the block copolymer layer 320.

Figure 18A:
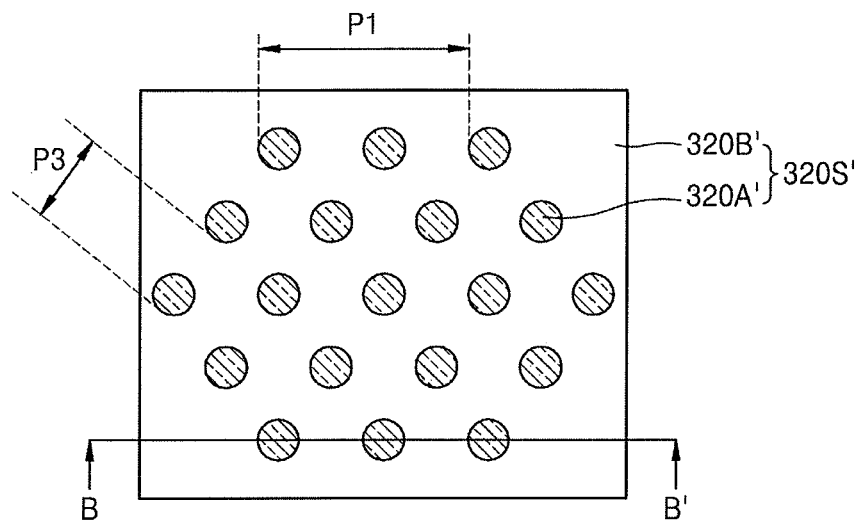
FIGS. 18A and 18B illustrate stages in a method of forming a micropattern, according to another embodiment.
Figure 18B:
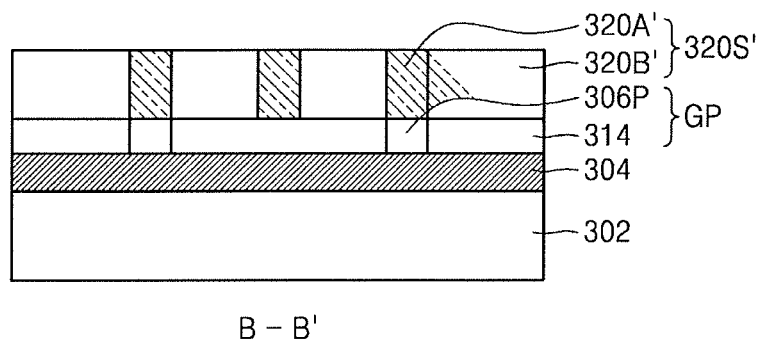

In an implementation, the plurality of pillars 312P may be arranged in a hexagonal array having the first pitch P1 that is N times (where N is an integer of 2 or more) the bulk cycle $L_0$ of the block copolymer layer 320. For example, the first pitch P1 of the plurality of pillars 312P may be 2 times the bulk cycle $L_0$ of the block copolymer layer 320. In this case, as shown in FIGS. 18A and 18B, each of a plurality of first domains 320A' may have a cylindrical shape and be self-aligned to be located in a middle portion of two adjacent pillars 312P among the plurality of pillars 312P, the plurality of first domains 320A' being formed by a phase separation process of the block copolymer layer 320.

The mask pattern 312 may include a photoresist. In an implementation, the mask pattern 312 may include a photoresist for KrF excimer lasers (248 nm), a photoresist for ArF excimer lasers (193 nm), a photoresist for ArF-immersion, a photoresist for F2 excimer lasers (157 nm), or a photoresist for extreme ultraviolet (EUV) light (13.5 nm).

Figure 12A:
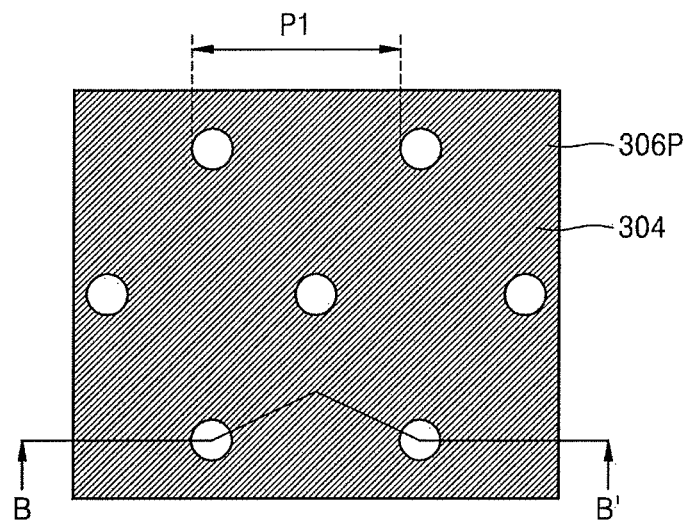
Figure 12B:
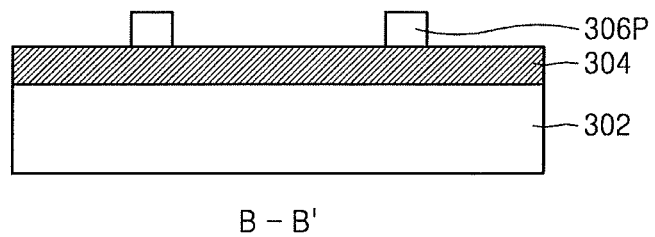

Referring to FIGS. 12A and 12B, the anti-reflective layer 310 and the pinning material layer 306 may be etched by using the mask pattern 312 (see FIGS. 11A and 11B) as an etch mask, thereby forming pinning patterns 306P and an anti-reflective pattern.

The pinning patterns 306P may be arranged in a regular shape. For example, the pinning patterns 306P may be arranged in a hexagonal array or a matrix array.

After the pinning patterns 306P are formed, upper surfaces of the pinning patterns 306P may be exposed by removing unnecessary layers.

Figure 13A:
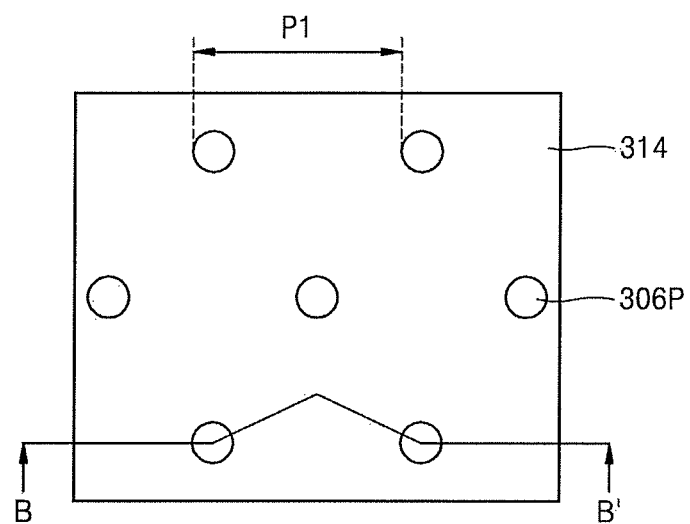
Figure 13B:
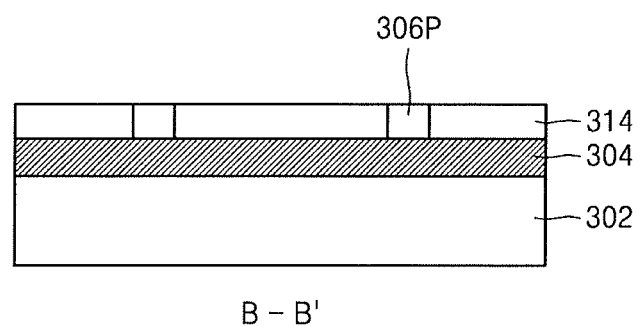

Referring to FIGS. 13A and 13B, a neutral pattern layer 314 may be formed on an exposed surface of the etching target layer 304. The neutral pattern layer 314 may be formed by coating a polymer material layer for forming a neutral pattern onto the exposed surface of the etching target layer 304.

In an implementation, the polymer material layer for forming the neutral pattern may be, e.g., a random copolymer including the first polymer moiety 213a and the second polymer moiety 213b in a constant ratio. The first polymer moiety 213a and the second polymer moiety 213b have been described with reference to FIGS. 7A and 7B. A molar ratio of the first polymer moiety 213a to the second polymer moiety 213b may be about 5:5 to about 3:7.

In an implementation, the polymer material layer for forming the neutral pattern may be, e.g., a random copolymer in which a repeating unit of the first homopolymer and a repeating unit of the second homopolymer are copolymerized in a constant ratio, the first homopolymer and the second homopolymer having been described with reference to FIGS. 8A and 8B. A molar ratio of the repeating unit of the first homopolymer to the repeating unit of the second homopolymer may be about 5:5 to about 3:7. In an implementation, depending upon a shape of a pattern intended to be formed, the molar ratio of the repeating unit of the first homopolymer to the repeating unit of the second homopolymer may be about 6:4 to about 4:6. In an implementation, depending upon a shape of a pattern intended to be formed, the molar ratio of the repeating unit of the first homopolymer to the repeating unit of the second homopolymer may be about 4:6 to about 2:8.

To form the neutral pattern layer 314, the random copolymer may be bonded to the surface of the etching target layer 304. To bond the random copolymer to the surface of the etching target layer 304, the surface of the etching target layer 304 may be terminated by a functional group, e.g., a carboxyl group (—COOH), an amine group (—NH$_2$), a sulfhydryl group (—SH), an epoxy group, or the like, instead of a hydroxyl group. In an implementation, the random copolymer may be a polymer material having a functional group, e.g., a hydroxyl group (—OH), an amine group, or a carboxyl group (—COOH), the functional group being capable of chemically reacting with the terminated functional groups.

In an implementation, the random copolymer may be a PS-r-PMMA copolymer having a hydroxyl group (—OH), an amine group, or a carboxyl group (—COOH). Here, a ratio of PMMA to PS may be about 5:5 to about 3:7.

In an implementation, the neutral pattern layer 314 may be a polystyrene copolymer including about 96 mol % to about 99.5 mol % of a styrene repeating unit and about 0.05 mol % to about 4 mol % of a (meth)acrylate repeating unit. In an implementation, the (meth)acrylate may be HEMA.

Whether the pinning patterns 306P and/or the neutral pattern layer 314 have been normally formed may be inspected. The inspection may be performed by the method described with reference to FIGS. 9 and 10.

Figure 14A:
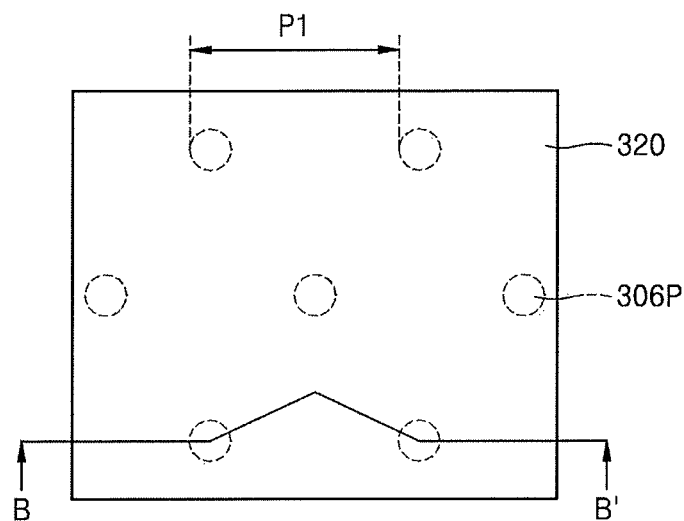
Figure 14B:
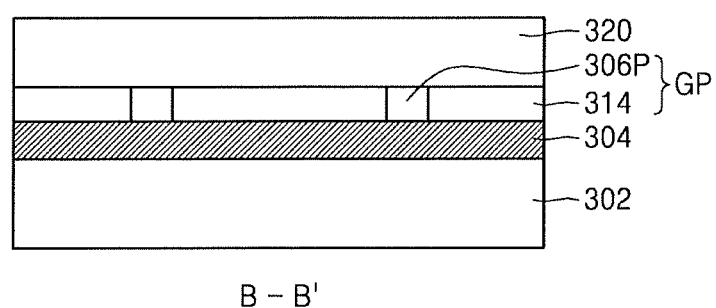

Referring to FIGS. 14A and 14B, a block copolymer layer 320 including a pure block copolymer may be formed above a guide pattern layer GP including the pinning patterns 306P, the pure block copolymer including a first polymer block and a second polymer block, the first polymer block and the second polymer block respectively having a first repeating unit and a second repeating unit.

The block copolymer layer 320 may be formed above the guide pattern layer GP to a constant thickness. In an implementation, the pure block copolymer may include a linear or branched polymer having a molecular weight of about 3,000 g/mol to about 2,000,000 g/mol.

In the pure block copolymer, the first polymer block may be PMMA, PEO, PLA, or PI. The second polymer block may be polystyrene (PS).

In the block copolymer layer 320, the second polymer block may constitute a major block, and the first polymer block may constitute a minor block. In an implementation, a molar ratio of the first polymer block to the second polymer block in the pure block copolymer may be about 20:80 to about 40:60.

In an implementation, the block copolymer layer 320 may be formed by a dip coating, solution casting, or spin coating process.

Figure 15A:
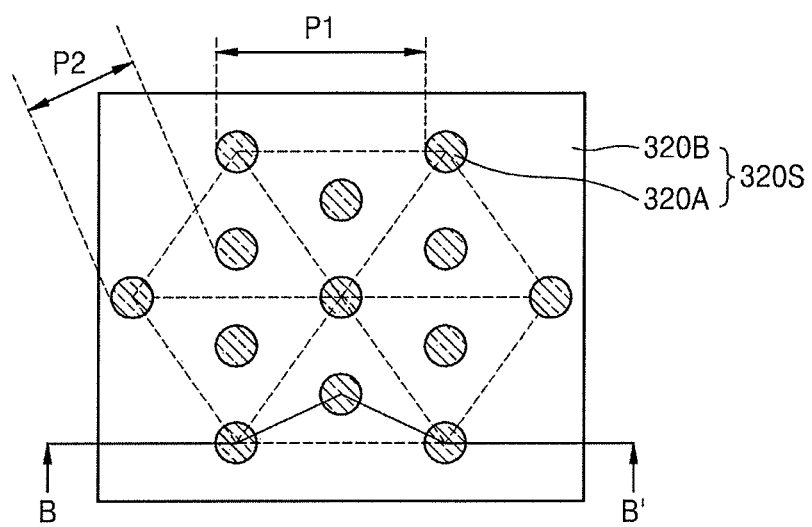
Figure 15B:
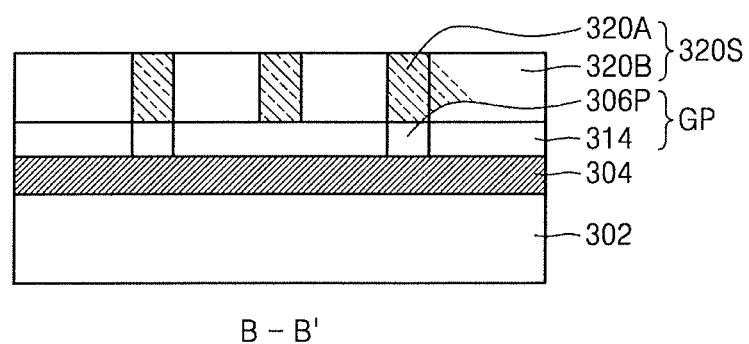

Referring to FIGS. 15A and 15B, phase separation of the block copolymer layer 320 (see FIGS. 14A and 14B) may be performed, whereby a self-assembled layer 320S including a plurality of first domains 320A and a second domain 320B may be formed, the plurality of first domains 320A including the first polymer block, the second domain 320B including the second polymer block and surrounding the plurality of first domains 320A. The bulk cycle $L_0$ determined in a bonding structure of the first polymer block and the second polymer block, that is, the bulk cycle $L_0$ corresponding to an intrinsic pitch with regard to a repeating unit of a self-assembled structure may be about 40 nm to about 60 nm, the self-assembled structure being obtained as a result of self-assembly from the block copolymer layer 320.

For the phase separation of the block copolymer layer 320, the block copolymer layer 320 may be annealed at a temperature that is higher than a glass transition temperature ($T_g$) of a block copolymer in the block copolymer layer 320. For example, to perform the phase separation of the block copolymer layer 320, the block copolymer layer 320 may be annealed at a temperature of about 130° C. to about 190° C. for about 1 hour to about 24 hours.

The plurality of first domains 320A may be regularly arranged. For example, due to the plurality of first domains 320A, a sub-hexagonal array may be obtained, the sub-hexagonal array having a second pitch P2 that is less than the first pitch P1.

The plurality of first domains 320A may be formed at locations corresponding to the plurality of pinning patterns 306P having properties that are equal or similar to those of the plurality of first domains 320A. In addition, each of a plurality of additional first domains 320A may be formed in a central portion of a triangle formed by three adjacent pinning patterns 306P among the plurality of pinning patterns 306P.

FIGS. 15A and 15B show an example in which each of the plurality of first domains 320A has a cylindrical shape and is self-aligned to be located in a central portion of a triangle formed by three adjacent pinning patterns 306P among the plurality of pinning patterns 306P.

In an implementation, as shown in FIGS. 18A and 18B, by the phase separation of the block copolymer layer 320 shown in FIGS. 14A and 14B, a self-assembled layer 320S' including a plurality of first domains 320A' and a second domain 320B' surrounding the plurality of first domains 320A' may be formed, each of the plurality of first domains 320A' being self-aligned in cylindrical form to be located in a middle portion of two adjacent pinning patterns 306P among the plurality of pinning patterns 306P. For this purpose, when the plurality of pillars 312P described with reference to FIGS. 11A and 11B are formed, the plurality of pillars 312P may be arranged in a hexagonal array having the first pitch P1, which is about 2 times the bulk cycle $L_0$ of the block copolymer layer. In this case, the plurality of first domains 320A' shown in FIGS. 18A and 18B may be regularly arranged. For example, due to the plurality of first domains 320N, a sub-hexagonal array may be obtained, the sub-hexagonal array having a third pitch P3 that is less than the first pitch P1.

Figure 16A:
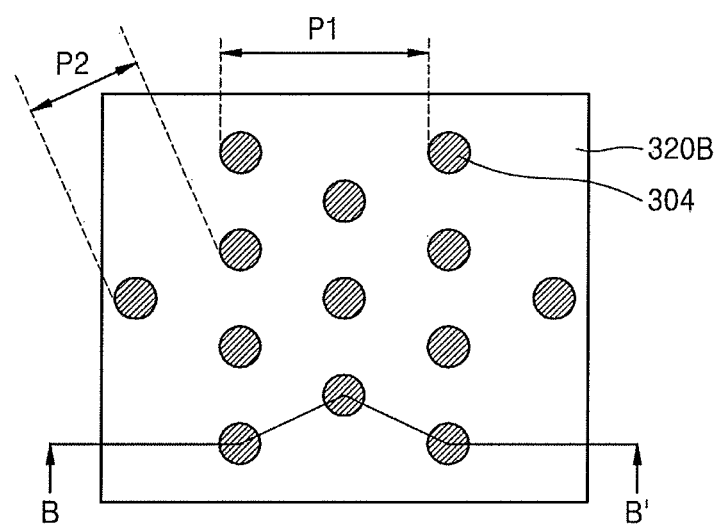
Figure 16B:
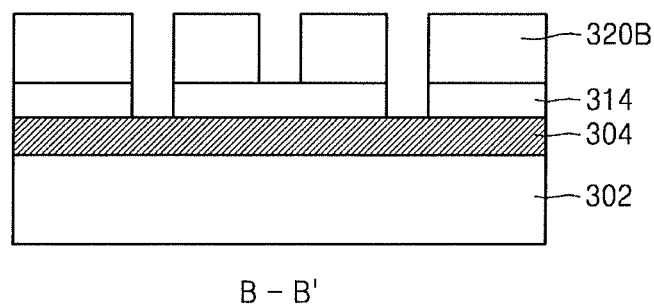

Referring to FIGS. 16A and 16B, the plurality of first domains 320A may be removed from the self-assembled layer 320S (see FIGS. 15A and 15B). In an implementation, the pinning patterns 306P may be removed together with the plurality of first domains 320A.

In an implementation, to selectively remove only the plurality of first domains 320A out of the self-assembled layer 320S, the plurality of first domains 320A may be selectively decomposed by applying a polymer decomposer to the self-assembled layer 320S, and then, the decomposed plurality of first domains 320A may be stripped by using a cleaning solution, e.g., isopropyl alcohol (IPA). In an implementation, radiant rays or plasma may be used as the polymer decomposer. The radiant rays may be provided in an oxygen atmosphere, and may be DUV rays, soft X-rays, or E-beams. The plasma may be oxygen plasma. To selectively decompose the plurality of first domains 320A, a kind or energy of the polymer decomposer may be selected. For example, threshold energy of the plurality of first domains 320A may be different from threshold energy of the second domain 320B, the threshold energy referring to energy allowing decomposition to be started. Thus, radiant rays or plasma may be applied to the self-assembled layer 320S, the radiant rays or the plasma having energy allowing selective decomposition of only the plurality of first domains 320A among the plurality of first domains 320A and the second domain 320B. The energy of the radiant rays or the plasma may be adjusted by irradiation time of the radiant rays or by plasma exposure time.

Figure 17A:
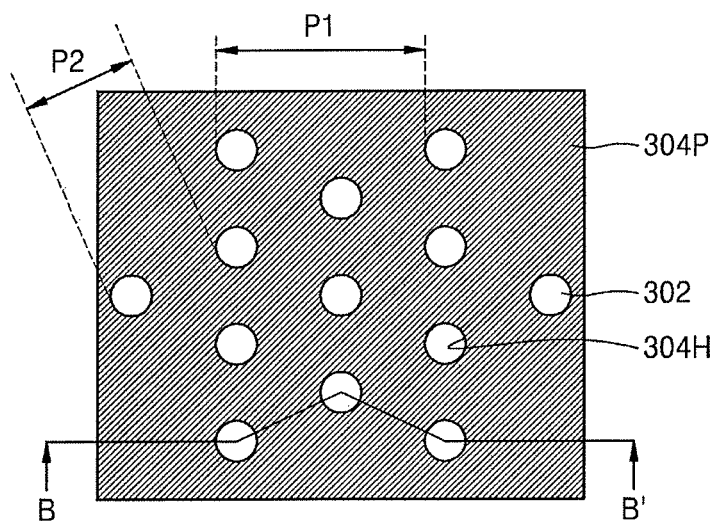
Figure 17B:
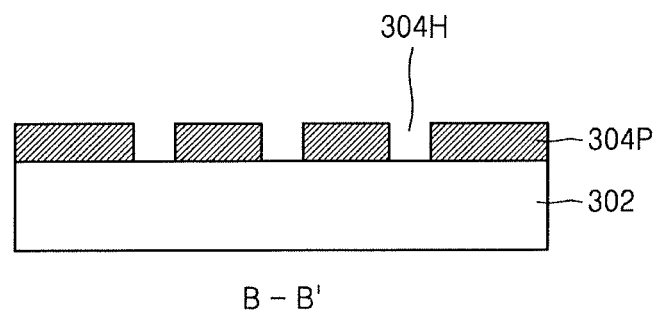

Referring to FIGS. 17A and 17B, the neutral pattern layer 314 and the etching target layer 304 may be etched by using the second domain 320B (see FIGS. 16A and 16B) as an etch mask, thereby forming a micropattern 304P including a plurality of holes 304H.

Next, unnecessary layers remaining on the micropattern 304P may be removed, thereby exposing an upper surface of the micropattern 304P.

FIGS. 19A to 19F illustrate stages in a method of forming a micropattern according to a process order, according to another embodiment.

Although contact hole patterns have been described with reference to FIGS. 11A to 17B, line-and-space patterns will be described with reference to FIGS. 19A to 19F.

Figure 19A:
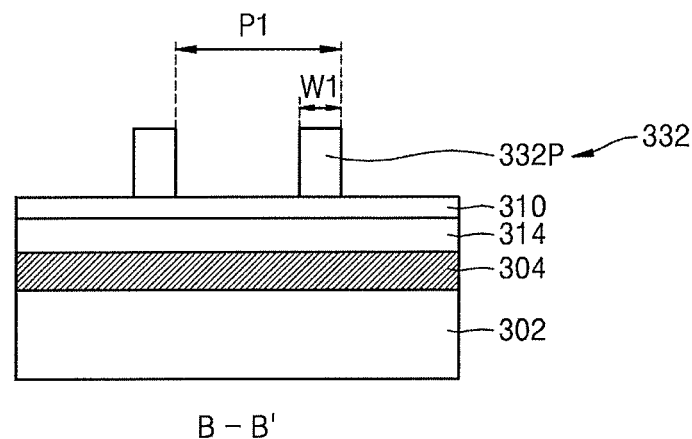
FIGS. 19A to 19F illustrate stages in a method of forming a micropattern according to a process order, according to another embodiment.

Referring to FIG. 19A, the etching target layer 304 may be formed on the substrate 302, and the pinning material layer 306 may be formed on the etching target layer 304. The anti-reflective layer 310 may be formed on the pinning material layer 306, and a mask pattern 332 including a plurality of line patterns 332P may be formed on the anti-reflective layer 310.

The substrate 302, the etching target layer 304, and the anti-reflective layer 310 have been described with reference to FIGS. 11A to 11B, and repeated descriptions thereof will be omitted.

The plurality of line patterns 332P formed as the mask pattern 332 may be arranged in a regular shape. For example, the plurality of line patterns 332P may have a width W1 and may be arranged according to a pitch P1. Here, P1 may be about 2.2 times to about 3.5 times W1.

Figure 19B:
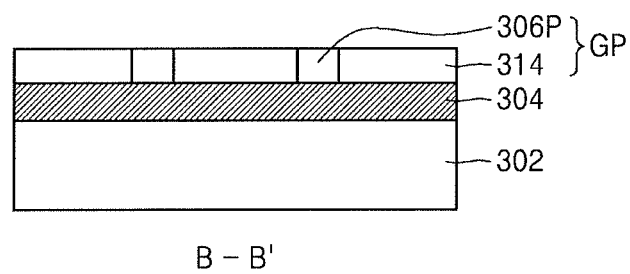

Referring to FIG. 19B, the anti-reflective layer 310 and the pinning material layer 306 may be etched by using the mask pattern 332 (see FIG. 19A) as an etch mask, thereby forming the pinning patterns 306P. Next, the upper surfaces of the pinning patterns 306P may be exposed by removing unnecessary layers. In addition, the neutral pattern layer 314 may be formed in spaces between the pinning patterns 306P, the spaces exposing the surface of the etching target layer 304. The formation of the neutral pattern layer 314 has been described with reference to FIGS. 12A to 13B, and repeated descriptions thereof will be omitted.

Whether the pinning patterns 306P and/or the neutral pattern layer 314 have been normally formed may be inspected. The inspection may be performed by the method described with reference to FIGS. 9 and 10, and additional descriptions thereof will be omitted.

Figure 19C:
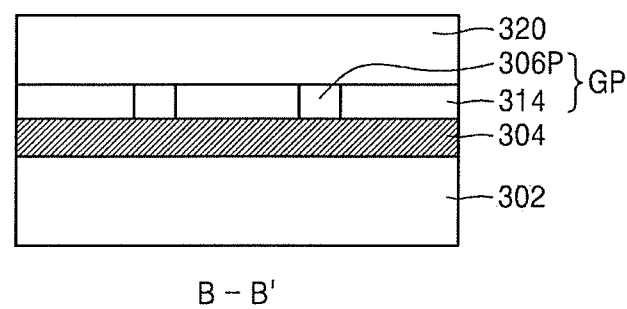

Referring to FIG. 19C, the block copolymer layer 320 including a pure block copolymer may be formed above the guide pattern layer GP including the pinning patterns 306P, the pure block copolymer including a first polymer block and a second polymer block, the first polymer block and the second polymer block respectively having a first repeating unit and a second repeating unit.

In the block copolymer layer 320, the second polymer block may constitute a major block, and the first polymer block may constitute a minor block. In an implementation, a molar ratio of the first polymer block to the second polymer block in the pure block copolymer may be about 40:60 to about 60:40. In an implementation, the molar ratio of the first polymer block to the second polymer block in the pure block copolymer may be about 50:50.

Figure 19D:
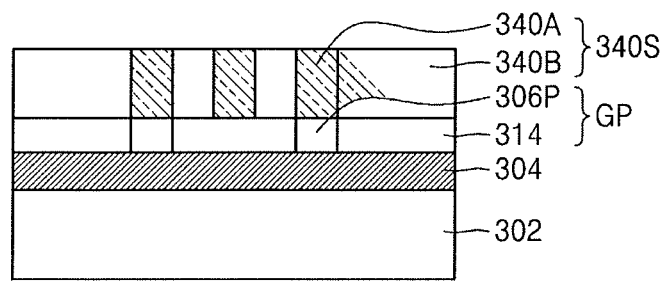

Referring to FIG. 19D, phase separation of the block copolymer layer 320 (see FIG. 19C) may be performed, whereby a self-assembled layer 340S including a plurality of first domains 340A and a second domain 340B may be formed, the plurality of first domains 340A including the first polymer block, and the second domain 340B including the second polymer block and being formed between the plurality of first domains 320A.

Although one first domain 340A is shown as being formed between the pinning patterns 306P in FIG. 19D, two or more first domains 340A may be formed between the pinning patterns 306P by appropriately adjusting the width W1 and the pitch P1 of the line patterns 332P of FIG. 19A.

Figure 19E:
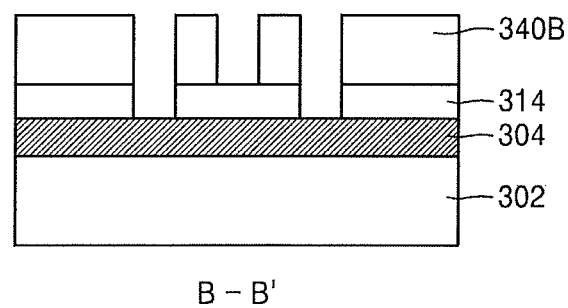

Referring to FIG. 19E, the plurality of first domains 340A may be removed from the self-assembled layer 340S (see FIG. 19D). In an implementation, the pinning patterns 306P may be removed together with the plurality of first domains 340A. A method of removing the plurality of first domains 340A has been described with reference to FIGS. 16A and 16B, and repeated descriptions thereof will be omitted.

Figure 19F:
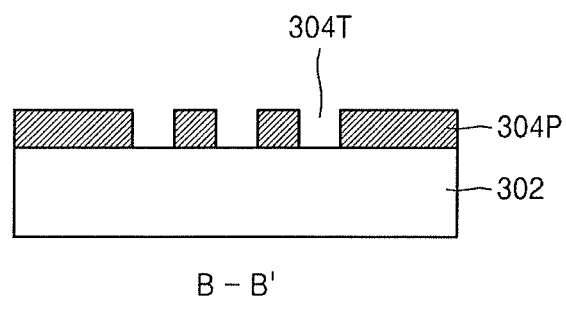

Referring to FIG. 19F, the neutral pattern layer 314 and the etching target layer 304 may be etched by using the second domain 340B (see FIG. 19E) as an etch mask, thereby forming the micropattern 304P including a plurality of trenches 304T.

Next, unnecessary layers remaining on the micropattern 304P may be removed, thereby exposing the upper surface of the micropattern 304P.

As described above, when the cantilever set for atomic force microscopes, the substrate surface inspection apparatus including the cantilever set, the method of analyzing the surface of the semiconductor substrate by using the substrate surface inspection apparatus, and the method of forming the micropattern by using the surface analysis method are used, the surface of the substrate may be directly and more precisely analyzed and inspected.

Figure 20:
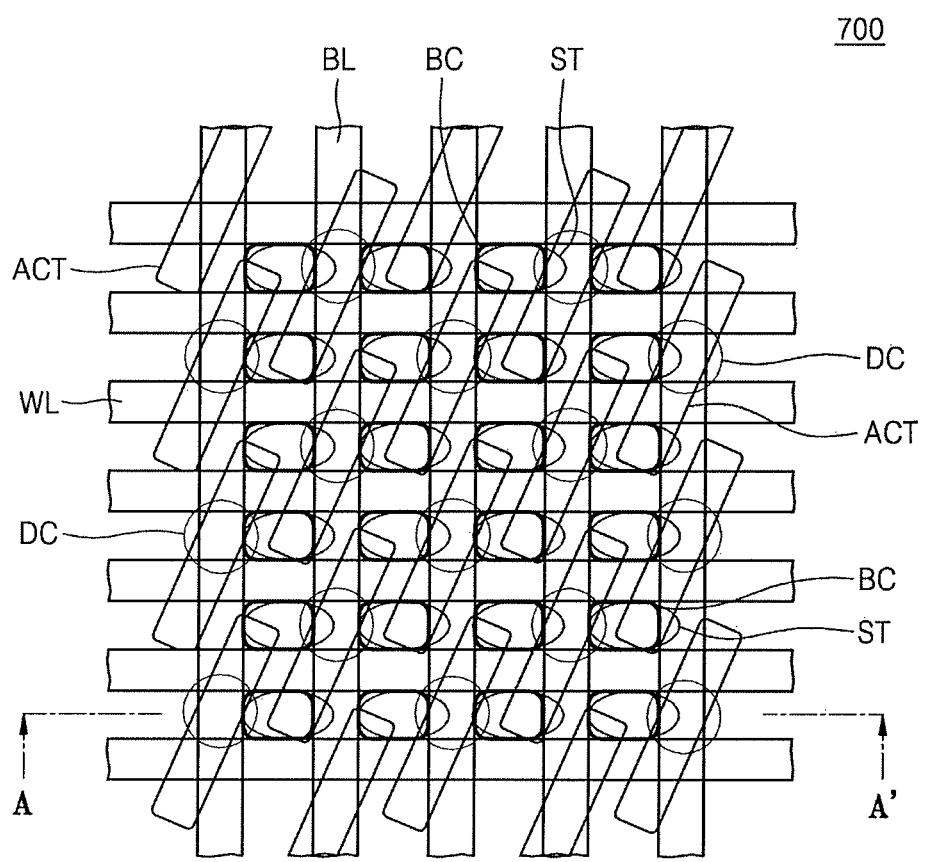
FIG. 20 illustrates an exemplary planar layout of an integrated circuit device which may be realized by using a method of forming a micropattern, according to an embodiment.

FIG. 20 illustrates an exemplary planar layout of an integrated circuit device 700 which may be realized by using the method of forming the micropattern, according to an embodiment. The layout shown in FIG. 20 may constitute a memory cell array region of a semiconductor memory device.

Referring to FIG. 20, a memory cell array region of the integrated circuit device 700 may include a plurality of active regions ACT. A plurality of word lines WL may cross the plurality of active regions ACT and extend parallel to each other along a first direction (X direction). The plurality of word lines WL may be arranged at equal intervals. On the plurality of word lines WL, a plurality of bit lines BL may extend parallel to each other along a second direction (Y direction) perpendicular to the first direction.

The plurality of bit lines BL may be connected to the plurality of active regions ACT through a plurality of direct contacts DC.

Each of a plurality of buried contacts BC may include a contact structure which extends from an area between two adjacent bit lines BL out of the plurality of bit lines BL to an upper side of one bit line BL out of the two adjacent bit lines BL. In an implementation, the plurality of buried contacts BC may be arranged in lines along the first direction (X direction) and the second direction (Y direction). In an implementation, the plurality of buried contacts BC may be arranged at equal intervals along the second direction (Y direction). The plurality of buried contacts BC may electrically connect lower electrodes ST to the active regions ACT, respectively.

The methods of forming the micropattern, which have been described with reference to FIGS. 11A to 19F, according to embodiments, may be used for forming the plurality of active regions ACT, the plurality of word lines WL, the plurality of bit lines BL, the plurality of direct contacts DC, the plurality of buried contacts BC, the plurality of lower electrodes ST, or the like.

FIGS. 21A to 21L illustrate cross-sectional views of stages in a method of fabricating an integrated circuit device according to a process order by using the methods of forming the micropattern, which has been described with reference to FIGS. 11A to 18B. FIGS. 21A to 21L show a configuration corresponding to a cross-sectional view taken along a line A-A' of FIG. 20.

In FIGS. 21A to 21L, the same reference numerals as in FIGS. 11A to 19F denote the same members, and thus, repeated detailed descriptions thereof will be omitted.

Figure 21A:
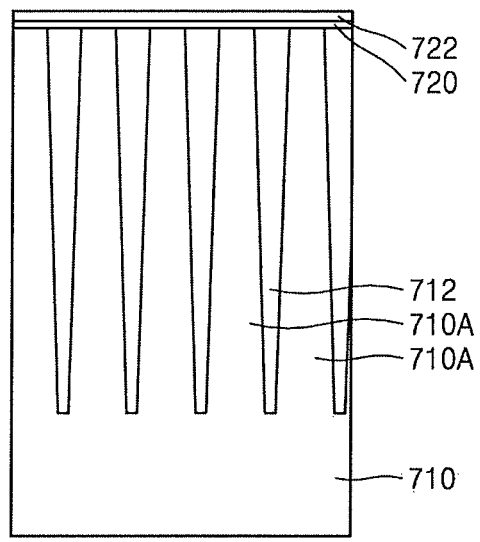
FIGS. 21A to 21L illustrate cross-sectional views of stages in a method of fabricating an integrated circuit device according to a process order, according to an embodiment.

Referring to FIG. 21A, a device isolation layer 712 may be formed in a substrate 710, thereby defining a plurality of active regions 710A.

Descriptions of the substrate 710 are the same as the descriptions of the substrate 302, which have been made with reference to FIGS. 11A and 11B.

Each of the plurality of active regions 710A may have a relatively long island shape having a major axis and a minor axis. To define the plurality of active regions 710A, at least one of the methods of forming the micropattern, which have been described with reference to FIGS. 11A to 18B, according to embodiments, may be used. For example, a plurality of line-shaped preliminary active regions extending parallel to each other may be defined, and then, when a trimming process is performed in order to make the plurality of line-shaped preliminary active regions into a plurality of island-shaped active regions which are finally desired, at least one of the methods of forming the micropattern, which have been described with reference to FIGS. 11A to 18B, according to embodiments, may be used.

In an implementation, the device isolation layer 712 may include an oxide layer, a nitride layer, or combinations thereof. The device isolation layer 712 may include a single layer including only one insulating layer or include multiple layers including at least two insulating layers.

A plurality of word line trenches (not shown) may be formed in the substrate 710. The plurality of word line trenches may have line shapes which extend parallel to each other along the X direction of FIG. 20 and cross the plurality of active regions 710A. Inside the plurality of word line trenches, a plurality of gate dielectric layers, a plurality of word lines WL (see FIG. 20), and a plurality of buried insulating layers are formed in the stated order.

In an implementation, after the word lines WL are formed, impurity ions may be implanted into both sides of each of the word lines WL, thereby forming source/drain regions in upper portions of the plurality of active regions 710A. In an implementation, before the plurality of word lines are formed, an impurity ion implantation process for forming the source/drain regions may be performed.

A first insulating layer 720 and a second insulating layer 722 may be formed in the stated order on the substrate 710. In an implementation, the first insulating layer 720 may include an oxide layer, and the second insulating layer 722 may include a nitride layer.

Figure 21B:
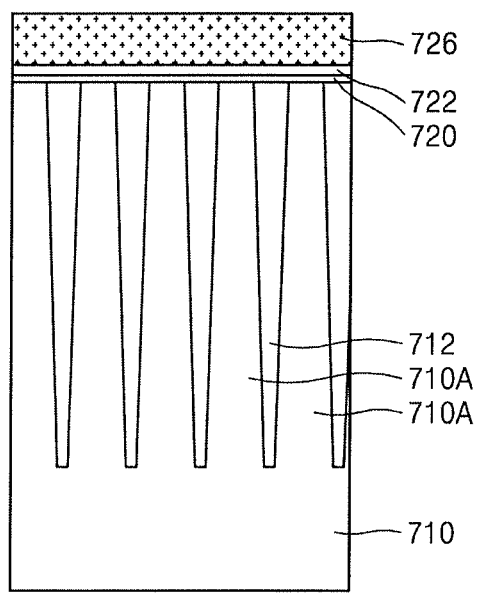

Referring to FIG. 21B, a first conductive layer 726 may be formed on the substrate 710. In an implementation, the first conductive layer 726 may include doped polysilicon.

Figure 21C:
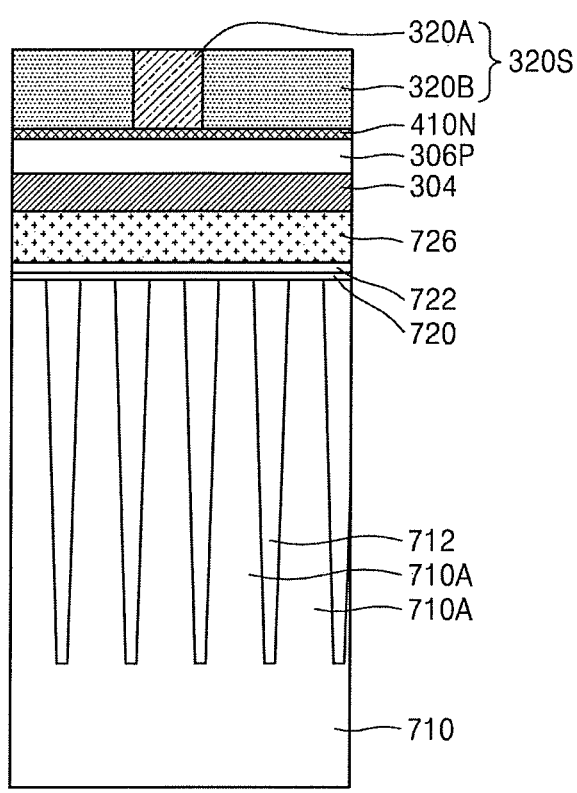

Referring to FIG. 21C, according to method similar to the methods described with reference to FIGS. 11A to 18B, the etching target layer 304 is formed on the first conductive layer 726, and the self-assembled layer 320S is formed on a first mask pattern 306P, the self-assembled layer 320S being phase-separated into the first domain 320A and the second domain 320B.

A neutral liner 410N may be further provided to a location between the etching target layer 304 and the second domain 320B.

Figure 21D:
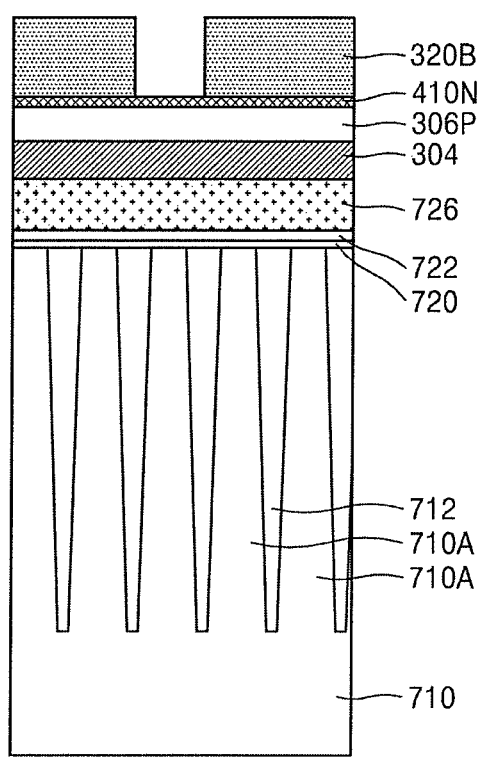

Referring to FIG. 21D, the first domain 320A may be removed from the self-assembled layer 320S (see FIG. 21C).

Figure 21E:
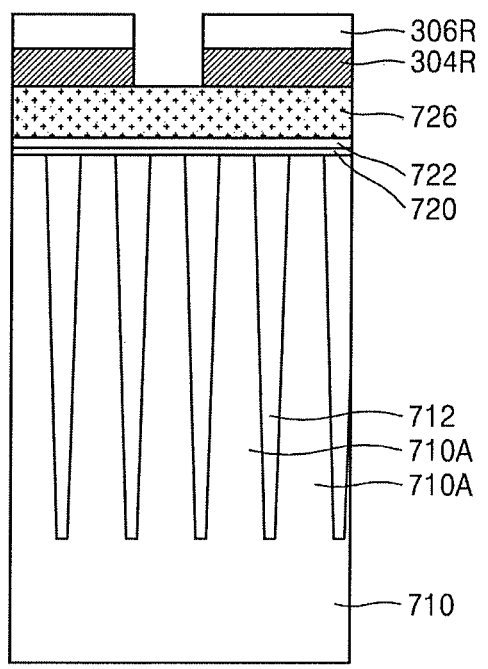

Referring to FIG. 21E, the first mask pattern 306P (see FIG. 21C) may be etched by using the second domain 320B as an etch mask, thereby forming a first mask pattern 306R which includes a hole exposing the etching target layer 304.

Next, unnecessary layers on the first mask pattern 306R may be removed, and the etching target layer 304 is etched by using the first mask pattern 306R as an etch mask, thereby forming a micropattern 304R which includes a hole exposing the first conductive layer 726.

Figure 21F:
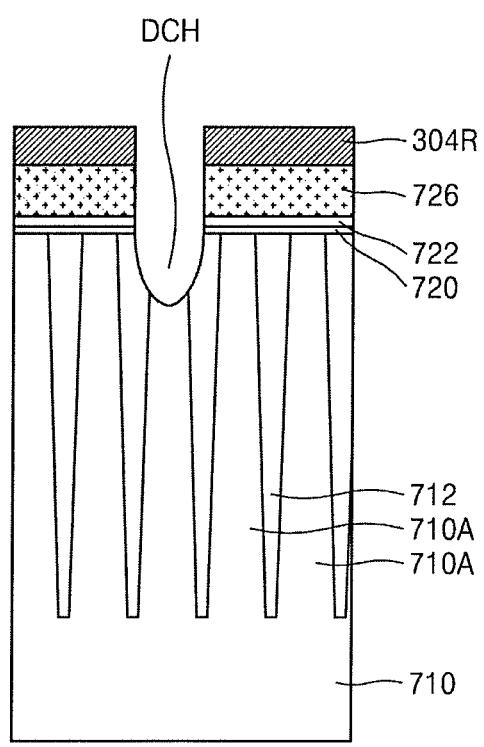

Referring to FIG. 21F, the first conductive layer 726 is etched by using the micropattern 304R as an etch mask, and as a result, an exposed portion of the substrate 710 and an exposed portion of the device isolation layer 712 are etched, thereby forming a direct contact hole DCH exposing the active region 710A of the substrate 710.

Although the first mask pattern 306R covering the micropattern 304R is shown as having been removed in FIG. 21F, the first mask pattern 306R may remain on the micropattern 304R, in some embodiments.

Figure 21G:
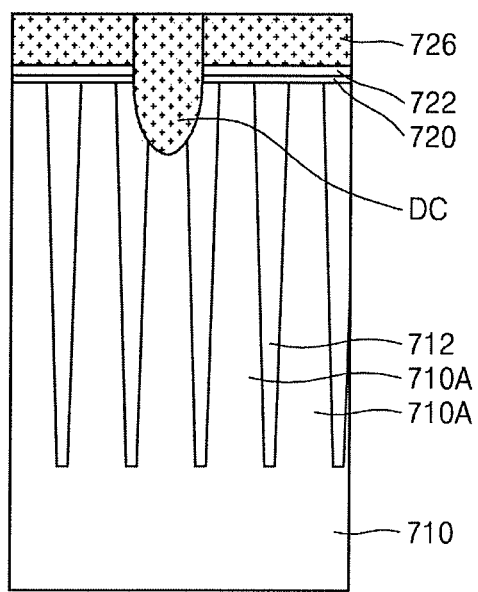

Referring to FIG. 21G, after the micropattern 304R (see FIG. 21F) is removed, a second conductive layer may be formed in the direct contact hole DCH and on an upper side of the first conductive layer 726, the second conductive layer having a thickness sufficient to fill the direct contact hole DCH. Next, the second conductive layer may be subjected to etch-back such that the second conductive layer remains only inside the direct contact hole DCH, thereby forming a direct contact DC which includes the second conductive layer remaining inside the direct contact hole DCH. In an implementation, the direct contact DC may include doped polysilicon.

Figure 21H:
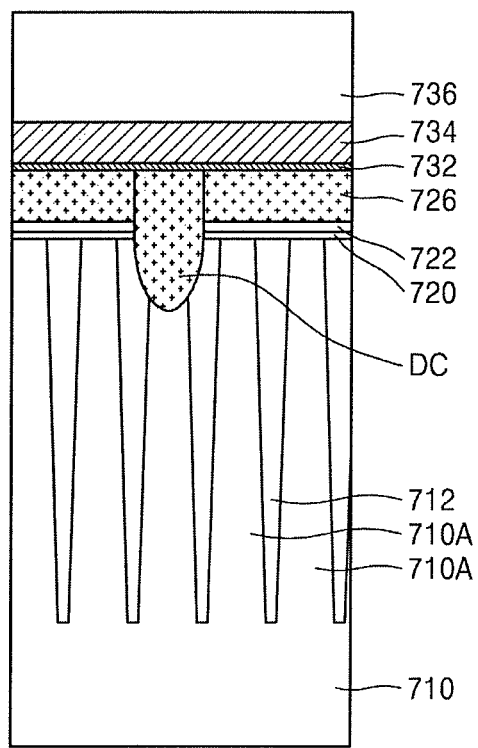

Referring to FIG. 21H, a third conductive layer 732, a fourth conductive layer 734, and an insulating capping layer 736 may be formed in the stated order on upper sides of the first conductive layer 726 and the direct contact DC. Each of the third conductive layer 732 and the fourth conductive layer 734 may include TiN, TiSiN, W, tungsten silicide, or combinations thereof. In an implementation, the third conductive layer 732 may include TiSiN, and the fourth conductive layer 734 may include W. The insulating capping layer 736 may include a silicon nitride layer.

Figure 21I:
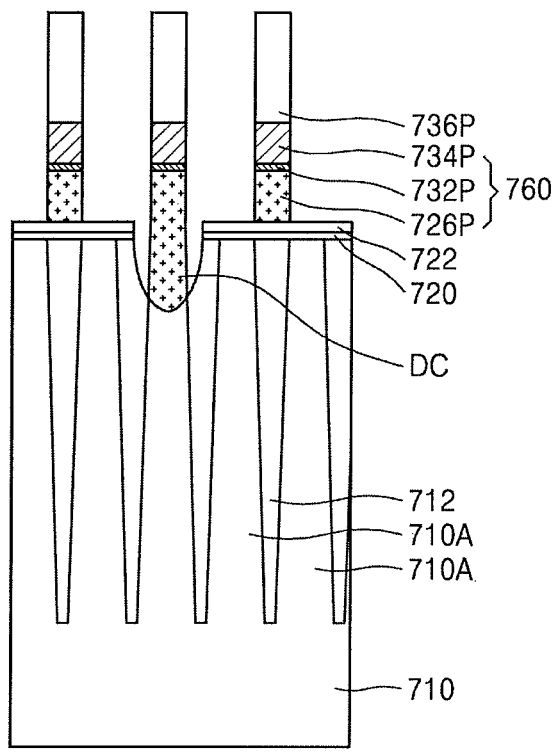

Referring to FIG. 21I, an insulating capping pattern 736P may be formed by patterning the insulating capping layer 736 by a photolithography process, and a portion of an underlying structure may be etched by using the insulating capping pattern 736P as an etch mask, thereby forming a plurality of bit lines 760. To form the plurality of bit lines 760, the fourth conductive layer 734, the third conductive layer 732, the first conductive layer 726, and a portion of the direct contact DC may be etched in the stated order by using the insulating capping layer 736 as an etch mask, thereby forming the plurality of bit lines 760 which includes a first conductive pattern 726P, a third conductive pattern 732P, and a fourth conductive pattern 734P. The plurality of bit lines 760 may be connected to the active regions 710A of the substrate 710 through direct contact DC.

Figure 21J:
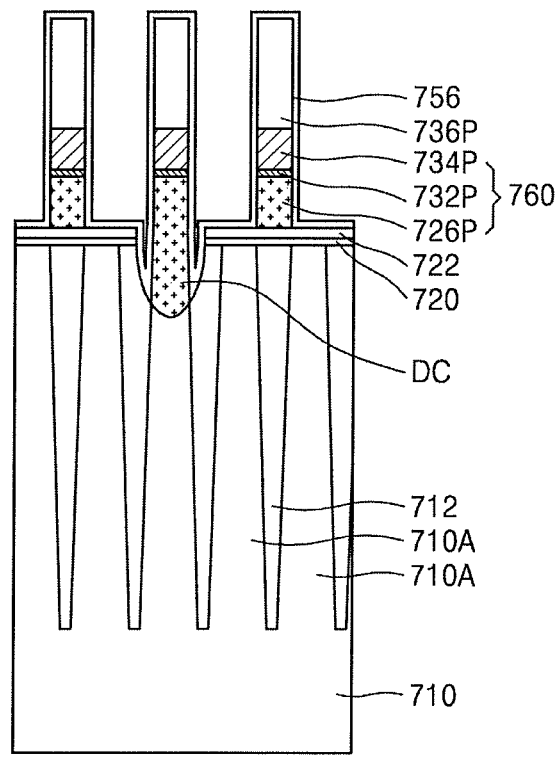

Referring to FIG. 21J, an insulating liner 756 may be formed on an exposed surface of a result product including the plurality of bit lines 760. In an implementation, the insulating liner 756 may include a nitride layer.

Figure 21K:
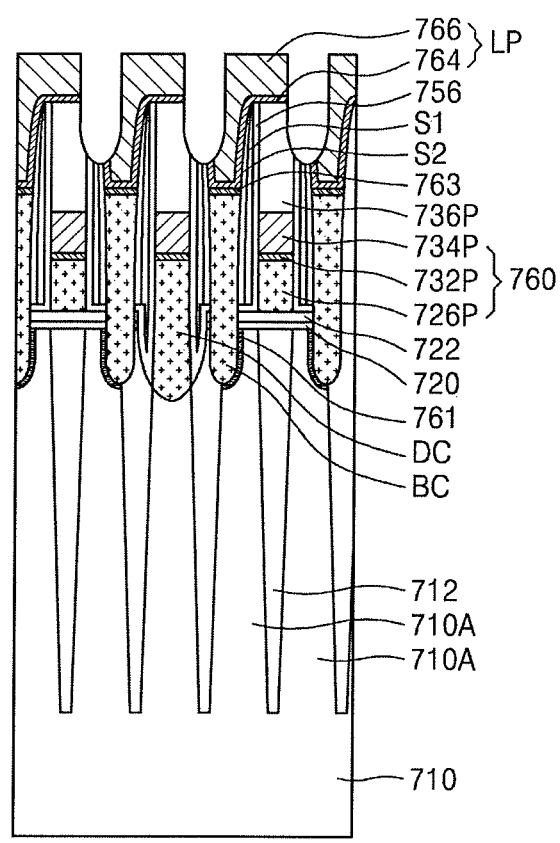

Referring to FIG. 21K, the plurality of buried contacts BC (see FIG. 20) and a plurality of conductive landing pads LP may be formed in spaces between the plurality of bit lines 760 in the result product of FIG. 21J, the plurality of conductive landing pads LP being respectively connected to the plurality of buried contacts BC. For example, insulating spacers S1 and S2 may be formed on the insulating liner 756 on a sidewall of each of the plurality of bit lines 760, the insulating spacers S1 and S2 covering the insulating liner 756, and a plurality of insulating patterns (not shown in FIG. 21K) may be respectively formed in the spaces between the plurality of bit lines 760, the plurality of insulating patterns respectively defining a plurality of holes for forming the buried contacts BC (see FIG. 20). Next, the active regions 710A of the substrate 710 may be exposed by the plurality of holes, and a metal silicide layer 761 may be formed on each of exposed surfaces of the active regions 710A. Next, a conductive layer may fill a lower portion of an inside of each of the plurality of holes, thereby forming the plurality of buried contacts BC which are respectively connected to the active regions 710A.

In an implementation, the metal silicide layer 761 may include cobalt silicide. In an implementation, the metal silicide layer 761 may include a material selected from among various metal silicides. In an implementation, the plurality of buried contacts BC may include doped polysilicon. In an implementation, the metal silicide layer 761 may be omitted.

In an implementation, the insulating spacers S1 and S2 may include a silicon oxide layer, a silicon nitride layer, air, or combinations thereof. Although the insulating spacers S1 and S2 are shown as including two layers in the present embodiment, the insulating spacers S1 and S2 may include a single layer or three layers. The plurality of insulating patterns may include a nitride layer, an oxide layer, or combinations thereof.

Next, a metal silicide layer 763 may be formed on each of the plurality of buried contacts BC inside the plurality of holes between the plurality of bit lines 760. In an implementation, the metal silicide layer 763 may include cobalt silicide. In an implementation, the metal silicide layer 763 may include a material selected from among various metal silicodes. In an implementation, the metal silicide layer 763 may be omitted.

Next, a conductive barrier layer and a conductive layer may be formed, and the conductive barrier layer and the conductive layer are subjected to etch-back such that the insulating spacers S1 and S2 are exposed. As a result, a portion of the conductive barrier layer and a portion of the conductive layer remain as a conductive barrier layer 764 and a conductive layer 766 on the metal silicide layer 763 while filling the inside of each of the plurality of holes, the conductive barrier layer 764 and the conductive layer 766 covering each of the plurality of bit lines 760.

In an implementation, the conductive barrier layer 764 may have a Ti/TiN stacked structure. In an implementation, the conductive layer 766 may include doped polysilicon, a metal, a metal silicide, a conductive metal nitride, or combinations thereof.

Next, in a cell array region, a mask pattern may be formed on the conductive layer 766, the mask pattern exposing a portion of the conductive layer 766. Next, the conductive barrier layer 764, the conductive layer 766, and surrounding insulating layers thereof may be etched by using the mask pattern as an etch mask, thereby forming the plurality of conductive landing pads LP including the remaining portions of the conductive barrier layer 764 and the conductive layer 766.

The plurality of conductive landing pads LP may have a plurality of island shapes spaced apart from each other, similarly to the plurality of buried contacts BC shown in FIG. 20. To form the plurality of conductive landing pads LP, a photolithography process may be used. Here, to form the plurality of conductive landing pads LP, one of the methods of forming the micropattern, which have been described with reference to FIGS. 11A to 18B, may be used.

Figure 21L:
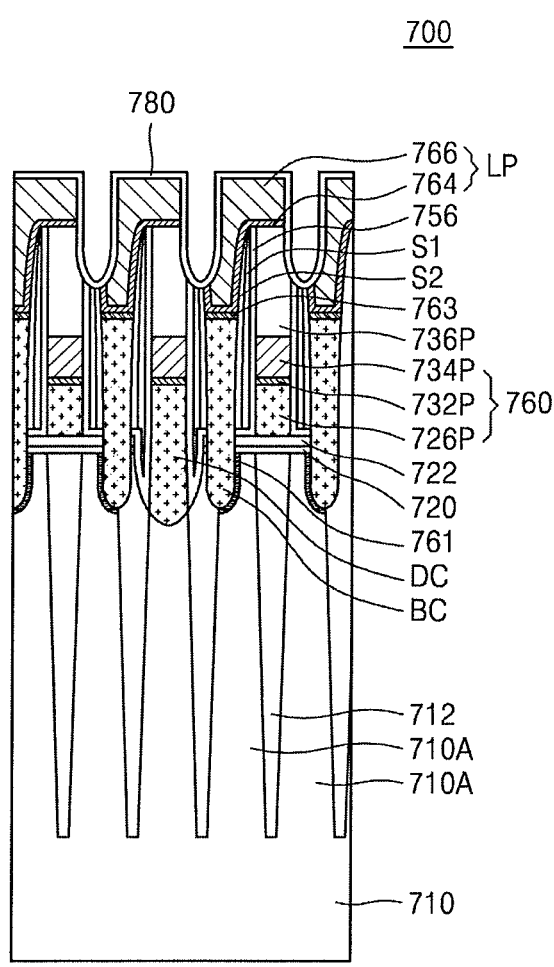

Referring to FIG. 21L, an insulating thin layer 780 may be formed on an upper surface of a resulting product including the plurality of conductive landing pads LP. In an implementation, the insulating thin layer 780 may include a nitride layer.

Next, an insulating layer may be formed on the insulating thin layer 780, and in the cell array region, a plurality of lower electrodes of capacitors are formed, the plurality of lower electrodes being respectively electrically connected to the plurality of conductive landing pads LP, thereby forming the integrated circuit device 700. The lower electrodes of the capacitors may correspond to the lower electrodes ST of FIG. 20.

Figure 22:
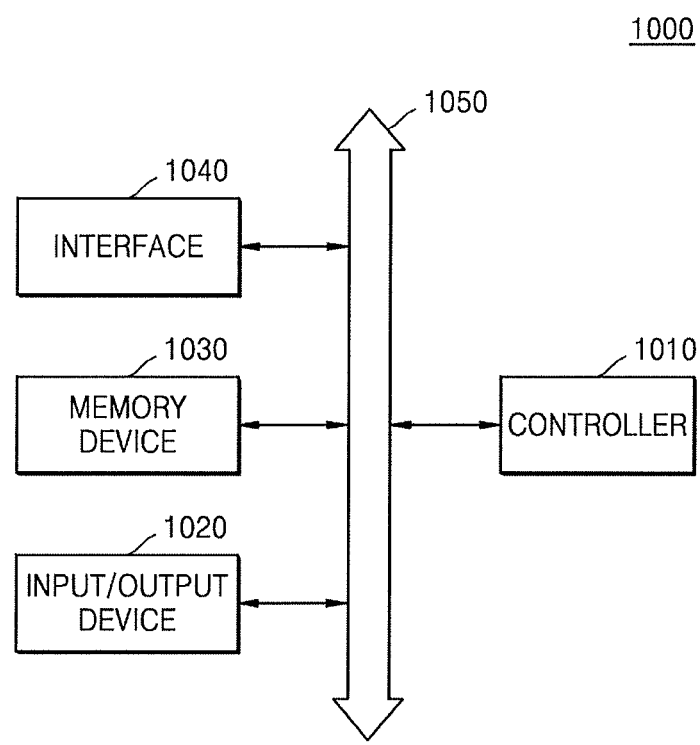
FIG. 22 illustrates a block diagram of a system including an integrated circuit device according to an embodiment.

FIG. 22 illustrates a block diagram of a system 1000 including an integrated circuit device according to an embodiment.

The system 1000 may include a controller 1010, an input/output device 1020, a memory device 1030, and an interface 1040. The system 1000 may be a mobile system or a system transmitting or receiving information. In an implementation, the mobile system may be a PDA, a portable computer, a web tablet, a wireless phone, a mobile phone, a digital music player, or a memory card. The controller 1010 may be for controlling programs executed in the system 1000 and may include a microprocessor, a digital signal processor, a microcontroller, or a device similar thereto. The input/output device 1020 may be used for inputting or outputting data of the system 1000. The system 1000 may be connected to a device external to the system 1000, for example, to a personal computer or a network, by using the input/output device 1020, and may exchange data with the external device. The input/output device 1020 may be, for example, a keypad, a keyboard, or a display.

The memory device 1030 may store codes and/or data for operations of the controller 1010 or may store data which has been processed by the controller 1010. The memory device 1030 may include at least one integrated circuit device obtained by the methods of forming the micropattern or the methods of fabricating the integrated circuit device, according to embodiments. For example, the memory device 1030 may include at least one integrated circuit device obtained by one of the methods of forming the micropattern, which have been described with reference to FIGS. 11A to 19F, or by one of the methods of fabricating the integrated circuit device, which have been described with reference to FIGS. 20 to 21L.

The interface 1040 may be a data transmitting path between the system 1000 and other devices external to the system 1000. The controller 1010, the input/output device 1020, the memory device 1030, and the interface 1040 may communicate with each other through a bus 1050. The system 1000 may be used for mobile phones, MP3 players, navigation systems, portable multimedia players (PMPs), solid state disks (SSDs), or household appliances.

Figure 23:
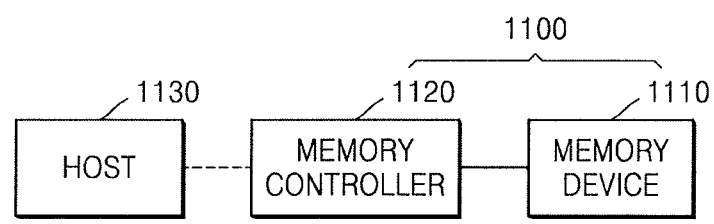
FIG. 23 illustrates a block diagram of a memory card including an integrated circuit device according to an embodiment.

FIG. 23 illustrates a block diagram of a memory card 1100 including an integrated circuit device according to an embodiment.

The memory card 1100 may include a memory device 1110 and a memory controller 1120. The memory device 1110 may store data. In an implementation, the memory device 1110 may have non-volatility allowing stored data to be intactly maintained even though the supply of power is interrupted. The memory device 1110 may include at least one integrated circuit device obtained by the methods of forming the micropattern or the methods of fabricating the integrated circuit device, according to embodiments. For example, the memory device 1110 may include at least one integrated circuit device obtained by one of the methods of forming the micropattern, which have been described with reference to FIGS. 11A to 19F, or by one of the methods of fabricating the integrated circuit device, which have been described with reference to FIGS. 20 to 21L.

The memory controller 1120 may read data stored in the memory device 1110 or may write data to the memory device 1110, in response to read/write requests of the host 1130. The memory controller 1120 may include at least one integrated circuit device obtained by the methods of forming the micropattern or the methods of fabricating the integrated circuit device, according to embodiments. For example, the memory controller 1120 includes at least one integrated circuit device obtained by one of the methods of forming the micropattern, which have been described with reference to FIGS. 11A to 19F, or by one of the methods of fabricating the integrated circuit device, which have been described with reference to FIGS. 20 to 21L.

By way of summation and review, directed self-assembly (DSA) technology may be capable of realizing such a design rule. A method of examining properties required for each process step may be desirable.

The embodiments may provide a method of forming a micropattern, the method allowing a surface of a substrate to be directly and more precisely analyzed and inspected.

The embodiments may provide a substrate surface inspection apparatus allowing a surface of a substrate to be directly and more precisely analyzed and inspected.

The embodiments may provide a cantilever set for atomic force microscopes, the cantilever set allowing a surface of a substrate to be directly and more precisely analyzed and inspected.

The embodiments may provide a method of analyzing a surface of a semiconductor substrate, the method allowing a surface of a substrate to be directly and more precisely analyzed and inspected.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate surface inspection apparatus, comprising:
a supporter capable of accommodating a substrate;
a measurement unit having a cantilever and a probe tip, the probe tip being at an end of the cantilever, the probe tip being capable of contacting the substrate, and the probe tip including a probe tip base having an apex surface thereof modified with a polymer;
a driving unit capable of changing relative positions of the substrate and the probe tip;
a light source unit capable of irradiating light onto the cantilever;
a sensor capable of obtaining information of a surface of the substrate from light reflected by the cantilever; and
a determination unit determining whether the surface of the substrate is normal from the information of the surface of the substrate sensed by sensor,
wherein:
the polymer is bonded to the probe tip base via an intervening linker, and the linker is connected to the polymer by an ester group or an ether group, or
the polymer is a di-block copolymer, and a block of the di-block copolymer at a bonding side to the probe tip has a constant length, or
the polymer includes two homopolymers bonded to the probe tip, a first homopolymer being hydrophilic, the first homopolymer being one of the two homopolymers, and a second homopolymer being hydrophobic, the second homopolymer being the other one of the two homopolymers.

2. The substrate surface inspection apparatus as claimed in claim 1, wherein the determination unit is configured to calculate a work of adhesion between the surface of the substrate and the probe tip and to determine whether the surface of the substrate is normal by comparing the obtained work of adhesion with a reference value.

3. The substrate surface inspection apparatus as claimed in claim 2, wherein:
the work of adhesion is calculated from a surface energy between the surface of the substrate and the probe tip, and
the surface energy is determined by an interaction between the probe tip and the surface of the substrate.

4. The substrate surface inspection apparatus as claimed in claim 3, wherein the substrate is a semiconductor substrate having pinning patterns and a neutral pattern layer on a surface thereof.

5. The substrate surface inspection apparatus as claimed in claim 1, wherein the polymer includes one of polystyrene, polymethylmethacrylate, poly(ethylene oxide), polydimethylsiloxane, poly(4-vinylpyridine), poly(2-vinylpyridine), poly(lactic acid), polyisoprene, and PS-r-PMMA.

6. A cantilever set for an atomic force microscope (AFM), the cantilever set comprising:
a supporting frame;
a cantilever fixed to the supporting frame; and
a probe tip provided to an end of the cantilever, the probe tip including a probe tip base having an apex surface thereof that is at least partially modified with a polymer,
wherein:
the polymer is bonded to the probe tip base via an intervening linker, and the linker is connected to the polymer by an ester group or an ether group, or
the polymer is a di-block copolymer, and a block of the di-block copolymer at a bonding side to the probe tip has a constant length, or
the polymer includes two homopolymers bonded to the probe tip, a first homopolymer being hydrophilic, the first homopolymer being one of the two homopolymers, and a second homopolymer being hydrophobic, the second homopolymer being the other one of the two homopolymers.

7. A probe tip for an atomic force microscope (AFM), the probe tip comprising:
a probe tip base; and
a polymer on at least a part of a surface of the probe tip base,
wherein:
the polymer is bonded to the probe tip base via an intervening linker, and the linker is connected to the polymer by an ester group or an ether group, or
the polymer is a di-block copolymer, and a block of the di-block copolymer at a bonding side to the probe tip has a constant length, or the polymer includes two homopolymers bonded to the probe tip, a first homopolymer being hydrophilic, the first homopolymer being one of the two homopolymers, and a second homopolymer being hydrophobic, the second homopolymer being the other one of the two homopolymers.

8. The probe tip as claimed in claim 7, wherein the probe tip is modified by at least partially coating the polymer onto the probe tip.

9. The probe tip as claimed in claim 7, wherein the probe tip is bonded to the polymer by a covalent bond.

10. The probe tip as claimed in claim 9, wherein the polymer includes one of polystyrene, polymethylmethacrylate, poly(ethylene oxide), polydimethylsiloxane, poly(4-vinylpyridine), poly(2-vinylpyridine), poly(lactic acid), polyisoprene, and PS-r-PMMA.

11. A method of forming a micropattern, the method comprising:
  forming pinning patterns on a semiconductor substrate;
  forming a neutral pattern layer in spaces between the pinning patterns; and
  inspecting a surface of a guide layer that includes the pinning patterns and the neutral pattern layer by using an atomic force microscope (AFM), wherein:
  the AFM includes:
  the probe tip as claimed in claim 7, the polymer on the at least a part of probe tip contacting the guide layer during inspecting of the surface of the guide layer, and
  a cantilever supporting the probe tip.

12. A substrate surface inspection apparatus, comprising:
  a supporter for accommodating a substrate;
  a measurement unit having a cantilever and the probe tip as claimed in claim 7, the probe tip being at an end of the cantilever and being capable of contacting the substrate;
  a driving unit for changing relative positions of the substrate and the probe tip;
  a light source unit for irradiating light onto the cantilever;
  a sensor for obtaining information of a surface of the substrate from light reflected by the cantilever; and
  a determination unit for determining whether the surface of the substrate is normal from the information of the surface of the substrate sensed by sensor.

13. A cantilever set for an atomic force microscope (AFM), the cantilever set comprising:
  a supporting frame;
  a cantilever fixed to the supporting frame; and
  the probe tip as claimed in claim 7 at an end of the cantilever.

14. A method of analyzing a surface of a semiconductor substrate, the method comprising:
  providing a semiconductor substrate having pinning patterns and a neutral pattern layer on the semiconductor substrate;
  scanning the pinning patterns or the neutral pattern layer by using the probe tip as claimed in claim 7; and
  measuring a work of adhesion between the probe tip and the scanned pinning patterns or the scanned neutral pattern layer.

* * * * *